(12) United States Patent
Nakagawa

(10) Patent No.: US 7,704,783 B2
(45) Date of Patent: Apr. 27, 2010

(54) METHOD OF MANUFACTURING CONDUCTIVE PATTERN AND ELECTRONIC DEVICE, AND ELECTRONIC DEVICE

(75) Inventor: Tohru Nakagawa, Osaka (JP)

(73) Assignee: Panasonic Corporation, Osaka (JP)

( * ) Notice: Subject to any disclaimer, the term of this patent is extended or adjusted under 35 U.S.C. 154(b) by 184 days.

(21) Appl. No.: 10/599,131

(22) PCT Filed: Oct. 14, 2005

(86) PCT No.: PCT/JP2005/018942

§ 371 (c)(1),
(2), (4) Date: Sep. 20, 2006

(87) PCT Pub. No.: WO2006/041153

PCT Pub. Date: Apr. 20, 2006

(65) Prior Publication Data

US 2007/0196577 A1    Aug. 23, 2007

(30) Foreign Application Priority Data

Oct. 15, 2004    (JP) .............................. 2004-301146

(51) Int. Cl.
*H01L 51/40* (2006.01)
(52) U.S. Cl. .......................................... 438/99; 257/40
(58) Field of Classification Search .................. 257/40; 438/99
See application file for complete search history.

(56) References Cited

U.S. PATENT DOCUMENTS

| 3,773,826 A | 11/1973 | Rondestvedt |
| 6,379,569 B1 | 4/2002 | Rouberol |
| 6,509,100 B1 | 1/2003 | Lee et al. |
| 6,734,029 B2 | 5/2004 | Furusawa |
| 2004/0147066 A1 | 7/2004 | Yamazaki et al. |
| 2004/0147113 A1 | 7/2004 | Yamazaki et al. |

FOREIGN PATENT DOCUMENTS

| JP | 10-204350 | 8/1998 |
| JP | 2000-155429 | 6/2000 |
| JP | 2000-340928 | 12/2000 |
| JP | 2002-134878 | 5/2002 |

(Continued)

OTHER PUBLICATIONS

Kumar et al., Features of gold having micrometer to centimeter dimensions . . . , Appl. Phys. Lett. 63 (14), Oct. 4, 1993, pp. 2002-2004.

(Continued)

*Primary Examiner*—Kenneth A Parker
*Assistant Examiner*—Anthony Ho
(74) *Attorney, Agent, or Firm*—Hamre, Schumann, Mueller & Larson, P.C.

(57) ABSTRACT

The manufacturing method includes forming a molecular film 16 of at least one kind of molecule on a part of a conductive film 13 by placing, on the conductive film 13, a solution 12 containing the one kind of molecule dissolved therein, with the one kind of molecule being selected from the group consisting of: a molecule expressed by Formula (1): $CF_3(CF_2)_n(CH_2)_mSH$, where n indicates a natural number of 3 to 7 while m denotes a natural number of 8 to 18; and a molecule expressed by Formula (2): $CF_3(CF_2)_p(CH_2)_qSS(CH_2)_{q'}(CF_2)_{p'}CF_3$, where p and p' each are a natural number of 3 to 7 independently while q and q' each are a natural number of 8 to 18 independently. Subsequently, the conductive film 13 located in a part where the molecular film 16 has not been formed is removed by bringing the conductive film 13 into contact with an etchant for the conductive film 13. Thus, a conductive pattern 17 is formed.

8 Claims, 15 Drawing Sheets

FOREIGN PATENT DOCUMENTS

| | | |
|---|---|---|
| JP | 2002-299833 | 10/2002 |
| JP | 2002-324966 | 11/2002 |
| JP | 2003-149831 | 5/2003 |

OTHER PUBLICATIONS

Rogers et al., Printing, molding, and near-field photolithographic method . . . , Synthetic Metals 115, 2000, pp. 5-11.

Whitesides et al., Wet chemical approaches to the characterization of Organic Surfaces . . . , Langmuir, 6, 1990, pp. 87-96.

Porter et al., Spontaneously organized molecular assemblies . . . , J. Am. Chem. Soc. 109, 1987, pp. 3559-3568.

Naud et al., Synthesis of terminally perfluroinated long-chain alkanethiols . . . , Journal of Fluorine Chemistry 104, 2000, pp. 173-183.

Graupe et al., Terminally perfluorinated long-chain alkanethiols, Journal of Fluorine Chemistry 93, 1999, pp. 107-115.

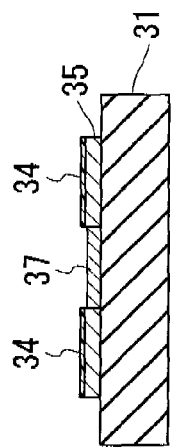
Fig.3F
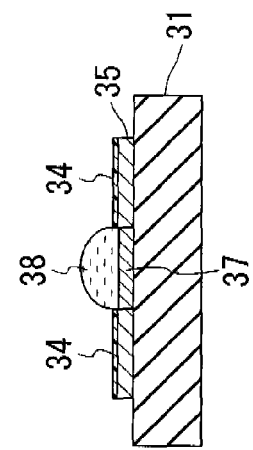
Fig.3G
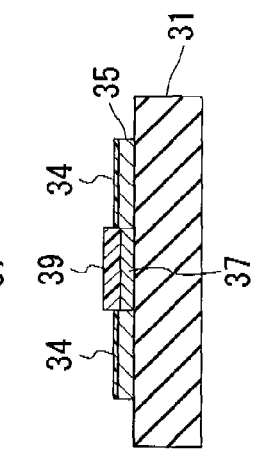
Fig.3H
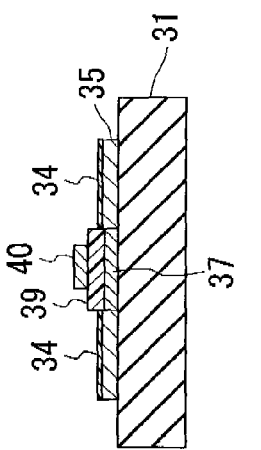
Fig.3I
Fig.3A
Fig.3B
Fig.3C
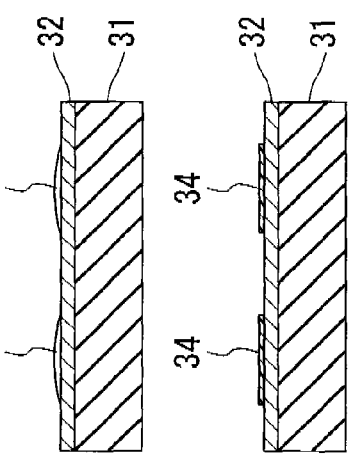
Fig.3D
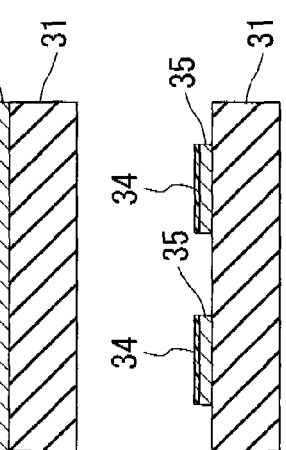
Fig.3E
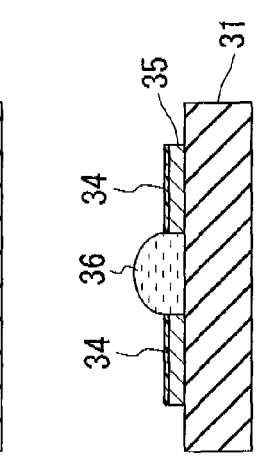

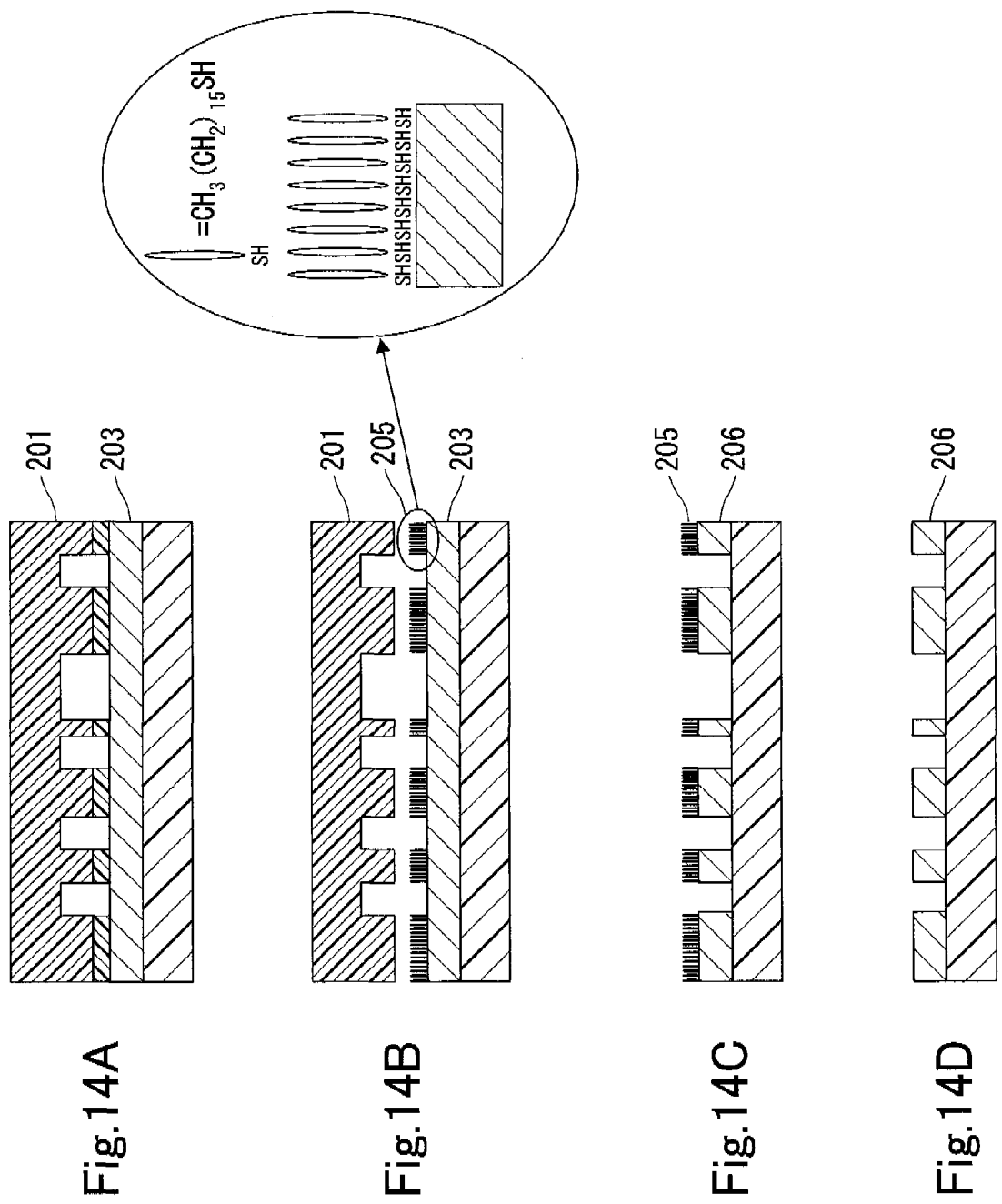

METHOD OF MANUFACTURING CONDUCTIVE PATTERN AND ELECTRONIC DEVICE, AND ELECTRONIC DEVICE

TECHNICAL FIELD

The present invention relates to a method of manufacturing a conductive pattern and an electronic device. Furthermore, the present invention also relates to an electronic device and a field effect transistor that both include a conductive pattern.

BACKGROUND ART

An electrode or wiring is created by forming a metal film in a predetermined pattern. The metal film usually is patterned using a photolithography method.

The photolithography method is useful as a method of patterning metal but has some problems. The first problem is that at least 90% of the resist liquid is wasted in a resist application process and therefore the material is wasted. The second problem is that an organic solvent, which may affect the environment adversely needs to be used in a large amount in a development process and a peeling process. The third problem is that since an expensive photomask is needed for each pattern, the manufacturing cost is high when various patterns are to be formed. In addition, there is a disadvantage in that a number of steps are required to carry out the photolithography method.

In order to solve these problems of the photolithography method, methods of forming a metal pattern using an ink-jet method or a microstamping method have been proposed in recent years. These methods are described below.

(1) Method of Forming Metal Pattern Using Ink-Jet Method

This utilizes a method of drawing images by discharging a fluid (the ink-jet method), which is used for an ink-jet printer.

A metal pattern can be formed by placing a metal paste in a predetermined position using the ink-jet method. With this method, the paste material can be used without being wasted and furthermore, the processes of developing and peeling the resist are no longer required.

In addition, there is a method of forming a resist film in a predetermined pattern by the ink-jet method, as another method that employs the ink-jet method. In this method, first, a resist liquid is applied to a metal film by the ink-jet method to form a resist film in a predetermined pattern. Thereafter, etching and resist peeling are carried out and thereby a metal pattern is formed. In this method, a resist film can be formed with a small amount of resist material. Furthermore, this method does not require the processes of exposing and developing the resist.

JP2002-299833A and JP2002-324966A disclose a method of forming a metal wiring pattern by discharging a paste containing resin and metal microparticles by the ink-jet method. JP10(1998)-204350 discloses a method of forming metal wiring by discharging a liquid containing metal microparticles with a sulfur compound adsorbed to the surfaces thereof, by the ink-jet method. JP2002-134878A discloses a method of forming a circuit pattern by discharging ink of metal microparticles by the ink-jet method. Further, JP2000-155429A discloses a method of forming a resist pattern by jetting liquid resin from a discharge head to form a desired pattern image on a substrate and then thermally curing the pattern image. JP2000-340928A discloses a method of forming a resist pattern by discharging ink that can be melted with heat by the ink-jet method, with the ink being in the molten state.

(2) Method of Forming Metal Pattern Using Microcontact Printing Method

A method of forming a resist pattern of alkanethiol using a stamp formed of silicone resin is disclosed (Appl. Phys. Lett., Vol. 63, No. 14 (1993), p 2002-2004). This method is illustrated in FIGS. 14A to 14D.

First, a stamp 201 formed of silicone resin is impregnated with an ethanol solution containing alkanethiol (hexadecanethiol in the drawings) and then is pressed onto the surface of a metal film 203 such as gold or copper (FIG. 14A). With this, a monomolecular film 205 of alkanethiol is formed on the surface of the metal film 203 (FIG. 14B). The alkanethiol is bonded to the metal film 203 through a mercapto group (—SH) and thereby the monomolecular film 205 with a thickness of 1 to 3 nm is formed. In the monomolecular film 205, since the molecules are lined up densely, it does not allow an etchant to pass therethrough and thus serves as a resist film.

Next, the metal film 203 is exposed to an etchant and thereby a metal pattern 206 is formed (FIG. 14C). Subsequently, the monomolecular film 205 is removed with, for instance, ozone or heat (FIG. 14D). It is disclosed that a gold pattern with a submicron width can be formed by this method (Synthetic Metals, Vol. 115 (2000), p 5-11).

Since the metal paste has a lower conductivity when it is not treated, the metal paste therefore needs to be baked to increase its conductivity when wiring or electrodes are to be formed with the metal paste. Accordingly, a baking step is required in the method of forming a metal pattern by discharging a metal paste by the ink-jet method. In order to obtain a conductivity equivalent to that of a metal pattern formed by the photolithography method, ideally it is necessary to bake the metal paste at a temperature around the melting point of the metal. Such a temperature, however, causes common substrates to be denatured thermally. Hence, the baking needs to be carried out at as low a temperature as possible. Particularly, when the substrate is a printed circuit board formed of resin, the baking temperature is preferably 200° C. or lower. Accordingly, the conductivity of the metal pattern formed by the ink-jet method is lower than that of one produced by the common photolithography method. The decrease in conductivity of the wiring of a circuit results in deterioration in performance of an electronic device.

The conventional method of discharging a resist liquid by the ink-jet method allows a metal pattern with a high conductivity to be formed easily, which is different from the method in which a metal paste is used. However, when a resist liquid is applied to a substrate by the ink-jet method, the resist liquid 211 that has been discharged spreads on the substrate 212 as shown in FIG. 15. Depending on the relationship between wettability of the substrate and the property of the resist liquid, the area of the resist liquid 211 that has been applied may be at least 10000 times larger than the sectional area of the discharged droplet in some cases. It therefore may be difficult to form a resist pattern with the high precision of the conventional method in some cases.

The method that employs the microcontact printing method hardly causes a pattern to spread since a monomolecular film is formed in only the part with which a stamp has been in contact. It, however, is necessary to produce a stamp for each pattern and therefore it is not suitable for cases where various kinds of products are to be produced in small amounts.

DISCLOSURE OF INVENTION

In such a situation, an object of the present invention is to provide a method that allows various conductive patterns to be manufactured easily with high precision and a method of manufacturing an electronic device using the above-mentioned method. Another object of the present invention is to provide an electronic device and a field effect transistor that have excellent characteristics.

In order to achieve the above-mentioned objects, a method of the present invention for manufacturing a conductive pattern includes the steps of: (i) forming a molecular film of at least one kind of molecule on a part of a conductive film by placing, on the conductive film, a solution in which the at least one kind of molecule has been dissolved, and (ii) removing the conductive film located in a part where the molecular film has not been formed, by bringing the conductive film into contact with an etchant for the conductive film. The one kind of molecule is selected from the group consisting of:

a molecule that is expressed by Formula (1):

$$CF_3(CF_2)_n(CH_2)_mSH \tag{1},$$

where n indicates a natural number in the range of 3 to 7 while m denotes a natural number in the range of 8 to 18; and a molecule that is expressed by Formula (2):

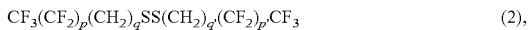

$$CF_3(CF_2)_p(CH_2)_qSS(CH_2)_{q'}(CF_2)_{p'}CF_3 \tag{2},$$

where p and p' each are a natural number in the range of 3 to 7 independently while q and q' each are a natural number in the range of 8 to 18 independently.

Furthermore, a method of the present invention for manufacturing an electronic device including a conductive pattern includes the steps of: (I) forming a molecular film of at least one kind of molecule on a part of a conductive film by placing, on the conductive film, a solution in which the at least one kind of molecule has been dissolved, and (II) forming the conductive pattern by bringing the conductive film into contact with an etchant for the conductive film and thereby removing the conductive film located in a part where the molecular film has not been formed. The above-mentioned at least one kind of molecule is selected from the group consisting of a molecule that is expressed by Formula (1) described above and a molecule that is expressed by Formula (2) described above.

An electronic device of the present invention is provided with a conductive pattern and includes a film of at least one kind of molecule that is present on the upper surface of the conductive pattern. The at least one kind of molecule is selected from the group consisting of a molecule that is expressed by Formula (1) described above and a molecule that is expressed by Formula (2) described above.

One of the field effect transistors of the present invention includes a source electrode, a drain electrode, and an organic semiconductor film disposed between the source electrode and the drain electrode. In this field effect transistor, the organic semiconductor film and the source electrode are in contact with each other by only the side face of the source electrode while the organic semiconductor film and the drain electrode are in contact with each other by only the side face of the drain electrode.

According to the present invention, conductive patterns (patterned conductive films) such as metal wiring, metal electrodes, etc. can be formed with high precision. In addition, since the method of manufacturing a field effect transistor of the present invention allows a semiconductor film to be disposed accurately between a source electrode and a drain electrode, the field effect transistor can be manufactured constantly as designed.

Moreover, in an example of the electronic device according to the present invention, a monomolecular film of fluoroalkyl mercaptan is formed on the surface of a conductive pattern such as metal wiring, a metal electrode, etc. Such an electronic device can prevent the surface of the conductive pattern from being contaminated and therefore provides an excellent electrical connection with, for instance, a solder.

BRIEF DESCRIPTION OF DRAWINGS

FIGS. 3A to 3I are cross-sectional views showing steps of an example of the method of the present invention for manufacturing a field effect transistor.

FIGS. 14A to 14D are cross-sectional views showing an example of the method of forming a metal pattern by a conventional stamping method.

DESCRIPTION OF THE INVENTION

Figure 1A:
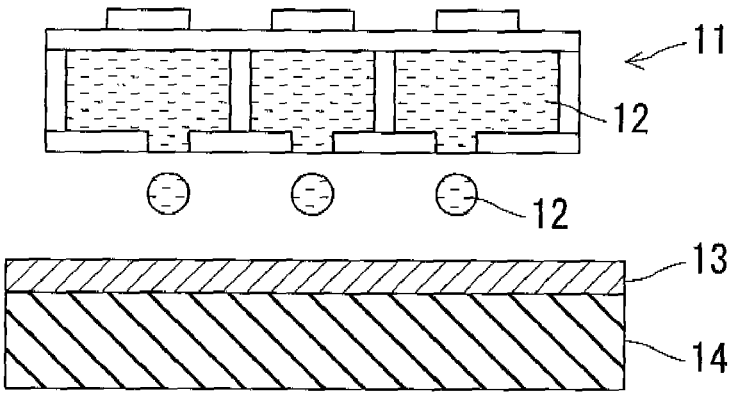
FIGS. 1A to 1D are cross-sectional views showing an example of the method of the present invention for manufacturing a conductive pattern.

Hereinafter, embodiments of the present invention are described. The present invention, however, is not limited to the embodiments and examples described below.

Method of Manufacturing Conductive Pattern

In the method of the present invention for manufacturing a conductive pattern, a molecular film of at least one kind of molecule (hereinafter also referred to as a "molecule (M)") is formed on a part of a conductive film by placing, on the conductive film, a solution (hereinafter also referred to as a "solution (S)") in which the at least one kind of molecule has been dissolved (Step (i)). The at least one kind of molecule is selected from the group consisting of:

a molecule that is expressed by Formula (1):

$$CF_3(CF_2)_n(CH_2)_mSH \qquad (1),$$

where n indicates a natural number in the range of 3 to 7 while m denotes a natural number in the range of 8 to 18; and a molecule that is expressed by Formula (2):

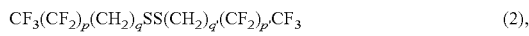

$$CF_3(CF_2)_p(CH_2)_qSS(CH_2)_{q'}(CF_2)_{p'}CF_3 \qquad (2),$$

where p and p' each are a natural number in the range of 3 to 7 independently while q and q' each are a natural number in the range of 8 to 18 independently.

In Step (i), the solution (S) is applied accurately to an arbitrary region using a method such as an ink-jet method, a screen printing method, an intaglio printing method, a relief printing method, etc. Particularly, when a minute pattern of 100 µm or smaller is to be formed, the ink-jet method can place the solution (S) more accurately as compared to the other methods. According to the method of the present invention, a monomolecular film can be formed in a predetermined position accurately by discharging a solution by, for example, the ink-jet method.

When a solvent of the solution (S) placed on the conductive film is removed, molecules (M) remaining on the conductive film form a molecular film. This molecular film serves as a resist film. The molecules of Formula (1) generally are bonded to the conductive film by their mercapto groups (—SH) to form a molecular film. The molecules of Formula (2) generally are bonded to the conductive film by their sulfur atoms to form a molecular film. Accordingly, if p=p'=n and q=q'=m, the film formed of the molecules of Formula (2) exhibits similar properties as those of the film formed of the molecules of Formula (1).

The molecules (M) may be one kind of molecules, may include a plurality of kinds of molecules that are expressed by Formula (1), or may include a plurality of kinds of molecules that are expressed by Formula (2). The molecules (M) may be commercially available molecules or may be synthesized. The molecules (M) can be synthesized by a well-known method. A preferable example of the molecules of Formula (1) is a molecule that is expressed by Formula (1) where n is in the range of 3 to 5 while m is in the range of 9 to 14. A preferable example of the molecules of Formula (2) is a molecule that is expressed by Formula (2) where p and p' are in the range of 3 to 5 while q and q' are in the range of 9 to 14. The details of the molecules (M) are described in Embodiment 1.

The method of removing the solvent of the solution (S) is not limited. The solvent may be removed by air drying or through heating or pressure reduction, for example.

After Step (i), the conductive film located in a part where the molecular film has not been formed is removed by bringing the conductive film into contact with an etchant for the conductive film (Step (ii)). Since the conductive film located in the part where the molecular film has been formed is not etched, a conductive pattern having the same shape as that of the pattern of the molecular film is formed in Step (ii).

According to the method of the present invention, electrodes or wiring with an arbitrary shape can be formed easily with high precision.

Preferably, the conductive film to be patterned contains at least one selected from the group consisting of gold, silver, copper, platinum, gallium arsenide, and indium phosphide. They are known as substances to which a mercapto group (—SH) can be bonded. A typical example of the conductive film is a metal film (particularly a gold film). A conductive film to which a mercapto group (—SH) can be bonded may be stacked on a conductive film to which a mercapto group cannot be bonded.

The solvent of the solution (S) is one in which the molecules (M) are dissolved. Preferably, the solvent of the solution (S) is one that tends to evaporate. Furthermore, it is preferable that the solvent of the solution (S) be one having lower wettability to the monomolecular film of the molecules (M). Specifically, it is preferable that a static contact angle of the solvent with respect to the monomolecular film of the molecules (M) be at least 20°.

The above-mentioned conductive film may be formed on a resin substrate (or a plastic substrate). The conductive film may be formed directly on the resin substrate or may be formed above the resin substrate indirectly, with another layer being interposed therebetween. Since the method of the present invention requires no baking step, the conductive pattern can be formed on the resin substrate easily. The conductive film also can be formed on a substrate other than the resin substrate, for example, an insulating substrate such as a glass substrate, a ceramic substrate, etc.

From another aspect, the present invention relates to a method of manufacturing an electronic device using the method of manufacturing a conductive pattern described above. The electronic device manufactured by this manufacturing method forms another aspect of the electronic device according to the present invention.

An example of the method of manufacturing a metal pattern is described as an example of the manufacturing method of the present invention. In this manufacturing method, a metal film is formed on a substrate. Subsequently, a solution in which $CF_3(CF_2)_n(CH_2)_mSH$ (where n indicates a natural number in the range of 3 to 6 while m denotes a natural number in a range of 8 to 18) has been dissolved is discharged onto the surface of the metal film to form a pattern of the solution on the metal film surface. Thereafter, the solvent contained in the solution located on the metal film surface is volatilized. The metal film then is exposed to an etchant to be etched. Thus a metal pattern is formed.

Method of Manufacturing Electronic Device and Field Effect Transistor

A method of the present invention for manufacturing an electronic device provided with a conductive pattern is described below. An example of the electronic device is a field effect transistor (hereinafter also referred to as a "FET") including a source electrode and a drain electrode that are formed as a conductive pattern. According to this manufacturing method, a field effect transistor of the present invention can be manufactured. In this manufacturing method, a conductive pattern is formed by the method of the present invention for manufacturing a conductive pattern.

In this method, a molecular film of molecules (M) is formed on a part of a conductive film by placing, on the conductive film, a solution in which the molecules (M) have been dissolved (Step (I)).

Subsequently, a conductive pattern is formed by bringing the conductive film into contact with an etchant for the conductive film and thereby removing the conductive film located in a part where the molecular film has not been formed (Step (II)).

Step (I) and Step (II) are identical to Step (i) and Step (ii), respectively, and the materials to be used therein also are identical. For instance, the conductive film may include at least one selected from the group consisting of gold, silver, copper, platinum, gallium arsenide, and indium phosphide. Furthermore, the conductive film may be formed on a resin substrate.

In the above-mentioned manufacturing method, the electronic device to be manufactured may be a field effect transistor and the conductive pattern may include a source electrode and a drain electrode. In this case, the manufacturing method may include, after Step (II), Step (III) of forming an organic semiconductor film between the source electrode and the drain electrode by placing a solution between the source electrode and the drain electrode, with the solution including an organic semiconductor material dissolved therein. The semiconductor film may be formed of a composite material of an organic material and an inorganic material.

An example of the method of manufacturing an organic FET in which a gate electrode is disposed above an organic semiconductor film is described below. In this method, first, a conductive film (for example, a metal film) is formed on a substrate and then is patterned by the above-mentioned method to form a source electrode and a drain electrode. Subsequently, a solution in which an organic semiconductor material has been dissolved is placed between the source electrode and the drain electrode. When the solvent contained in this solution is removed, an organic semiconductor film is formed between the source electrode and the drain electrode. An insulating film then is formed on the organic semiconductor film and a gate electrode is formed on the insulating film. Thus, an organic FET is manufactured.

An example of the method of manufacturing an organic FET in which a gate electrode is disposed below an organic semiconductor film is described below. In this method, first, a gate electrode is formed on a substrate and then an insulating film is formed on the gate electrode. Subsequently, a conductive film (for example, a metal film) is formed on the insulating film. The conductive film then is patterned by the above-mentioned method to form a source electrode and a drain electrode. Next, a solution in which an organic semiconductor material has been dissolved is placed between the source electrode and the drain electrode. When the solvent contained in this solution is removed, an organic semiconductor film is formed between the source electrode and the drain electrode. Thus, an organic FET is manufactured.

Electronic Device and Field Effect Transistor

An electronic device of the present invention is an electronic device provided with a conductive pattern (a patterned conductive film). A molecular film of the molecules (M) described above is present on the upper surface of the conductive pattern. This electronic device can be manufactured using the above-mentioned method for manufacturing a conductive pattern.

The patterned conductive film is used as an electrode or wiring. Electronic components such as a resistor, a capacitor, a semiconductor device, and a CCD may be mounted on the patterned conductive film. Since the conductive film covered with the film of the molecules (M) has liquid repellency, contaminants tend not to adhere to the surface of the conductive film and contaminants that have adhered thereto can be removed easily. Adhesion of contaminants to the surface of the electrodes or wiring may result in a poor connection in soldering or wire bonding in some cases. The electronic device of the present invention can prevent such a poor connection from occurring.

In the electronic device of the present invention, the conductive pattern described above may serve as a source electrode and a drain electrode. This electronic device functions as a FET. In this case, the electronic device may include an organic semiconductor film disposed between the source electrode and the drain electrode. Furthermore, in this case, the organic semiconductor film and the source electrode may be in contact with each other by only the side face of the source electrode while the organic semiconductor film and the drain electrode may be in contact with each other by only the side face of the drain electrode.

The electronic device and the field effect transistor of the present invention may be formed on a resin substrate.

From another aspect, an example of the FET of the present invention is a FET including a source electrode, a drain electrode, and an organic semiconductor film disposed between the source electrode and the drain electrode. In this FET, the organic semiconductor film and the source electrode are in contact with each other by only the side face of the source electrode. Similarly, the organic semiconductor film and the drain electrode are in contact with each other by only the side face of the drain electrode.

In this FET, a film of mercaptan having a fluoroalkyl chain at its end may be formed on the upper surfaces of the source electrode and the drain electrode. For instance, a molecular film of the above-mentioned molecules (M) may be disposed on the upper surfaces of the source electrode and the drain electrode.

In this FET, a gate insulating film and the source electrode may be in contact with each other by only the side face of the source electrode while the gate insulating film and the drain electrode may be in contact with each other by only the side face of the drain electrode.

Embodiment 1

An example of the method for manufacturing a conductive pattern is described below with reference to FIG. 1. First, as shown in FIG. 1A, droplets of a solution 12 are discharged from an ink-jet head 11 toward a conductive film 13 located on a substrate 14. In the solution 12, molecules (M) have been dissolved. The substrate 14 is formed of an insulating material such as plastic, glass, ceramics, etc.

Figure 1B:
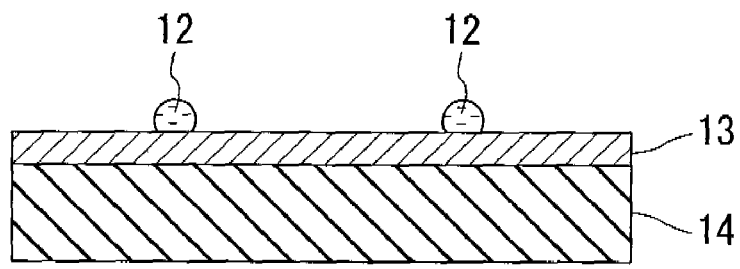
Figure 1C:
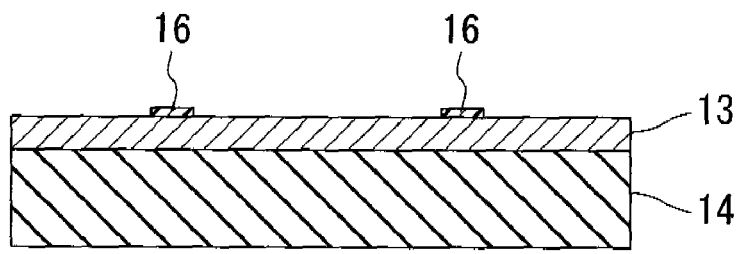

As described later, the inventors found out that the solution of the molecules (M) formed an accurate pattern without spreading on the conductive film 13. As shown in FIG. 1B, the solution 12 placed on the conductive film 13 does not spread from the position where it was placed. Accordingly, when the solvent contained in the solution 12 evaporates, a molecular film 16 is formed that has the same shape as that of the pattern in which the solution 12 was placed, as shown in FIG. 1C.

Figure 1D:
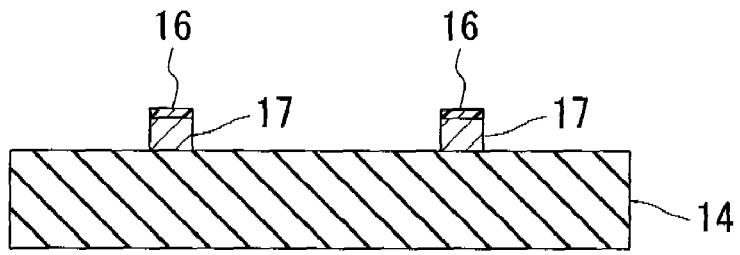

Subsequently, the conductive film 13 is immersed in an etchant to be etched. In this case, the molecular film 16 serves as a resist film and thereby only the conductive film 13 located in the region where the molecular film 16 has not been formed is removed. Consequently, as shown in FIG. 1D, a conductive pattern 17 is formed.

The principle that the molecular film 16 with a desired pattern can be formed accurately by using the above-mentioned molecules (M) is described with reference to FIGS. 2A to 2D. In FIGS. 2A to 2D, $CF_3(CF_2)_3(CH_2)_{11}SH$ was used as the molecules (M).

Figure 2A:
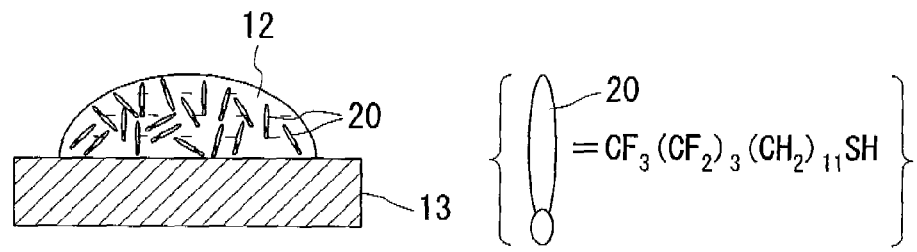
FIGS. 2A to 2D are cross-sectional views showing details of a step of forming an organic molecular film that is included in the manufacturing steps shown in FIG. 1.
Figure 2B:
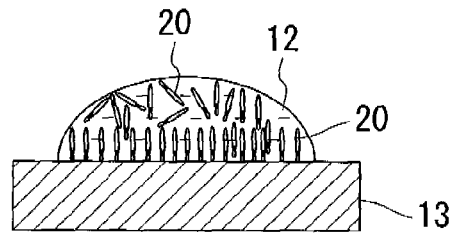
Figure 2C:
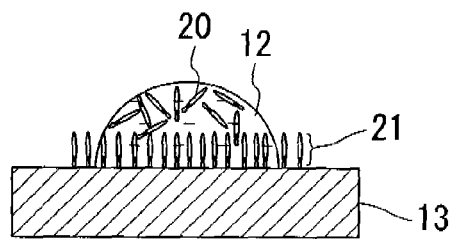

FIG. 2A shows the state of the solution 12 immediately after it was placed on the conductive film 13 located on the substrate 14. The molecules 20 (the molecules (M)) that have been dissolved in the solution 12 are bonded chemically to the conductive film 13 by their mercapto groups (FIG. 2B). As a result, a monomolecular film 21 of the molecules 20 is formed (FIG. 2C). Since the monomolecular film 21 has a fluoroalkyl chain, the surface energy of the monomolecular film 21 is lower than that of the conductive film 13. Accordingly, as shown in FIG. 2C, the solution 12 is repelled by the surface of the monomolecular film 21 and thereby contracts. Consequently, the solution 12 applied to the conductive film 13 does not spread thereon and thus the monomolecular film 21 with a desired pattern can be formed accurately.

Figure 2D:
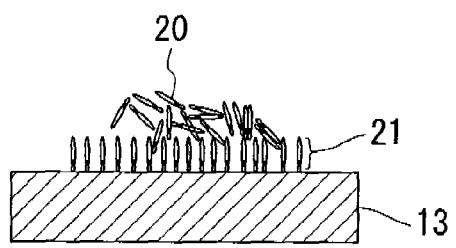

FIG. 2D is a schematic view showing the state after the solvent contained in the solution 12 evaporates. When the number of the molecules 20 contained in the solution 12 is larger than that of molecules required to form the monomolecular film in the region to which the solution 12 has been applied, molecules 20 that are not bonded to the conductive film 13 deposit on the monomolecular film 21. Both the surface energy of the region where the monomolecular film 21 alone is present and the surface energy of the region where the molecules 20 have deposited on the monomolecular film 21 are lower than that of the conductive film 13.

Since a $CF_3$ group is present at the surface of the region where the monomolecular film 21 alone is present, the surface energy thereof decreases to near 6 dyne/cm. On the other hand, since a $CF_3$ group, a $CF_2$ group, and a $CH_2$ group are present in a mixed state at the surface of the region where the molecules 20 have deposited on the monomolecular film 21, the surface energy thereof is between 6 and 20 dyne/cm. With either of these surface energies, the solution 12 is repelled by the surface of the molecular film.

As described above, in order for the solution placed on the conductive film not to spread thereon, the surface of the film of the molecules (M) formed on the conductive film needs to have a property of repelling the solution. As a result of study, the inventors found out that when n was 3 or larger in a molecule of $CF_3(CF_2)_n(CH_2)_mSH$ (where n and m each were an integer of 0 or larger), the film had a surface energy of 20 dyne/cm or lower and thereby had a property of repelling the solution. The reason for that is not clear at present but can be presumed to be as follows.

It has been known that the liquid repellency of a monomolecular film of $CH_3(CH_2)_n$—O—$(CH_2)_{16}SH$ (where n is an integer of 0 or larger) formed on a thin gold film increases with an increase in the number n and becomes constant when $n \geq 3$ (Langmuir, 1990, Vol. 6, No. 1, p 87-96). It is considered that when n is 2 or smaller, the surface energy of the monomolecular film is affected by the ether group (C—O—C) that is present inside the molecule. On the other hand, it is conceivable that when n is 3 or larger, the surface energy is not affected by the ether group and therefore has a value that reflects the original property of the hydrocarbon chain ($CH_3(CH_2)_n$) sited at the end of the molecule. The number n of the fluorocarbon chain ($CF_3(CF_2)_n$) of the molecules (M) that are used in the present invention is 3 or larger. Accordingly, the surface of the film of the molecules (M) is considered to have surface energy that is derived from the fluorocarbon chain.

The inventors found out that the molecules (M) described above formed a high density monomolecular film on metal and the monomolecular film then served as a resist film against an etchant for the metal. In this context, the term "high density" denotes that the molecules that form the monomolecular film have a high surface density on the substrate surface. Generally, the cohesive forces among the hydrocarbon chains $((CH_2)_m)$ are greater than those among the fluoroalkyl chains $((CF_2)_n)$ (Intermolecular & Surface Forces, written by J. Israelachivili, Academic Press, London, 1991). Accordingly, in the case of using molecules with no fluoroalkyl chain, a dense monomolecular film is formed. Hence, alkyl mercaptan is used in a conventional microstamping method. However, when alkyl mercaptan is placed on a metal film by the ink-jet method, the solution placed on the metal film spreads thereon and thus a monomolecular film cannot be formed precisely in a desired position.

On the other hand, when no alkyl chains are present, that is, when $m=q=q'=0$ in Formulae (1) and (2) described above, a monomolecular film can be formed precisely in a desired position. The monomolecular film to be formed in this case, however, has lower density that allows an etchant to pass therethrough and therefore does not serve as a resist film. The inventors found out this fact and made further studies. As a result, the inventors found out that the use of the molecules (M) described above allowed a monomolecular film that serves as a resist film to be formed precisely in a desired position.

A dense molecular film having resistance to an etchant can be formed through the use of the molecules of Formula (1) where m is in the range of 8 to 18. This is consistent with the fact that the molecules that are expressed by a formula of $CH_3(CH_2)_jSH$ (j is an integer of 0 or larger) form a dense monomolecular film on a substrate of gold or copper when $j \geq 7$, and thereby it becomes difficult for ions to permeate this film (Journal of American Chemical Society, vol. 109, p 3559-3568, 1987).

Furthermore, the degree to which a solution spreads on a metal film can be controlled through the use of a solution containing the molecules (M) and molecules other than the molecules (M) (fluoroalkyl mercaptan and/or alkyl mercaptan other than the molecules (M)) in a suitable ratio. As a result, this makes it possible to form a metal pattern, with the degree to which a solution spreads being controlled. For instance, suppose that the linewidth obtained when metal wiring is formed using a solution containing the molecules (M) alone is L1 while the linewidth obtained when using a solution containing alkyl mercaptan alone is L2. The linewidth can be set between L1 and L2 by using a mixed solution in which those two kinds of organic molecules have been dissolved in a suitable ratio.

Examples of the solvent in which the molecules (M) are dissolved include alcohol (ethanol, propanol, butanol, etc.), ester (methoxyethanol, ethoxyethanol, ethylene glycol monoethyl ether, ethylene glycol monomethyl ether, etc.) that is a derivative thereof, dichloromethane, silicone oil, or mixed solutions thereof.

Preferably, the conductive film 13 to be patterned is formed of a conductive material having a property that allows a mercapto group to be bonded thereto. Currently, known conductive materials to which a mercapto group can be bonded include gold, silver, copper, platinum, gallium arsenide, and indium phosphide. At the present, the mechanism of forming a bond between such a material and a mercapto group has not been understood completely. Hence, there is a possibility of the discovery of conductive materials to which a mercapto group is bonded, other than the materials described above. Furthermore, a mercapto group also is bonded to an alloy or compound that contains gold, silver, copper, platinum, gallium arsenide, or indium phosphide. Accordingly, such an alloy also can be used as a material for the conductive pattern.

After the conductive pattern is formed, the molecular film (the film of the molecules (M)) that is present on the upper surface of the conductive pattern can be removed, but does not need to be removed. The molecular film can be removed by, for example, heating it to a temperature (for instance, at least 100° C.) around the boiling point of the molecules or higher to evaporate the molecules. Moreover, when the molecular film is exposed to an ozone atmosphere, the molecules of the molecular film are ashed and thereby the molecular film can be removed even at room temperature.

Embodiment 2

An example of the method of the present invention for manufacturing a FET and an example of the FET that is manufactured by the method are described with reference to FIGS. 3A to 3I. First, as shown in FIG. 3A, a conductive film 32 is formed on a substrate 31. The substrate 31 is made of, for instance, an insulating material such as plastic, glass, ceramics, etc. The conductive film 32 is made of gold, silver, copper, platinum, gallium arsenide, indium phosphide, or a material containing such a substance. The conductive film 32 can be formed using a vacuum sputtering method, an electron beam vapor deposition method, or an electroless plating method, for example.

Next, as shown in FIG. 3B, a solution 33 in which the molecules (M) have been dissolved is discharged onto the conductive film 32 by the ink-jet method and thereby is placed in the shapes of a source electrode and a drain electrode. The solution 33 does not spread on the conductive film 32 as described in Embodiment 1. Accordingly, an accurate pattern can be formed.

After the solvent contained in the solution 33 placed on the conductive film 32 evaporates, as shown in FIG. 3C, an organic molecular film 34 of the molecules (M) is formed in the regions where the solution 33 was placed. The organic molecular film 34 is a monomolecular film or a film in which the molecules (M) have deposited irregularly on the monomolecular film. The organic molecular film 34 has a function as a resist film.

Subsequently, the conductive film 32 is exposed to an etchant that dissolves the conductive film 32. Thus only the conductive film 32 located in the regions covered with the pattern of the organic molecular film 34 remains while the conductive film 32 located in the other regions is removed. As a result, the pattern of the electrodes 35 (a source electrode and a drain electrode) is formed as shown in FIG. 3D. The upper surfaces of the electrodes are covered with the molecules (M) having a fluoroalkyl chain and therefore have liquid repellency.

Figure 4:
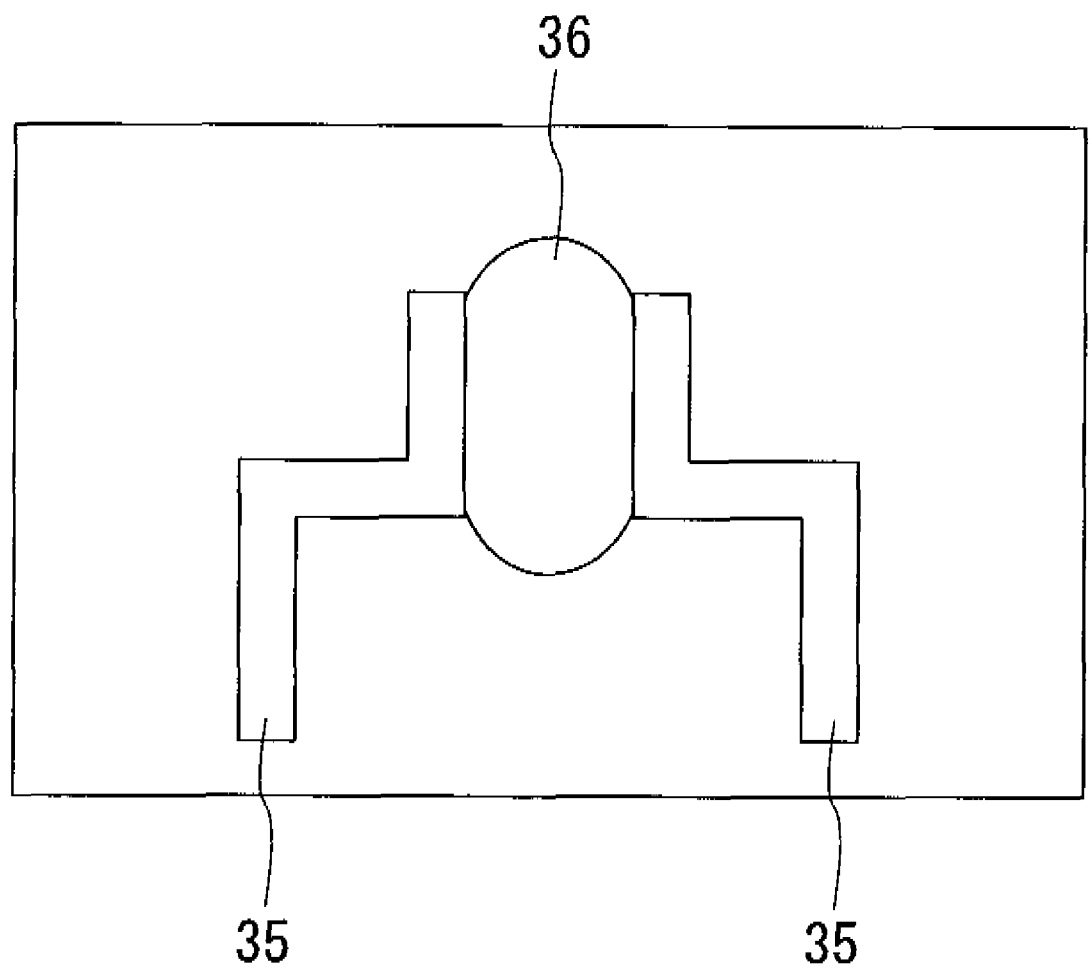
FIG. 4 is a plan view showing a state at the moment when a solution containing a semiconductor material dissolved therein is dropped between a source electrode and a drain electrode.

Next, a solution 36 in which an organic semiconductor material has been dissolved is placed between the two electrodes 35. As shown in FIG. 3E, the solution 36 does not spread over the electrodes 35 whose upper surfaces have liquid repellency and therefore is present only between the two electrodes 35. That is, the solution 36 comes into contact with only the side faces of the electrodes 35 and does not comes into contact with the upper surfaces thereof FIG. 4 is a plan view showing the state immediately after the solution 36 was placed between the two electrodes 35.

As shown in FIG. 3F, after the solvent contained in the solution 36 evaporates, an organic semiconductor film 37 is formed between the two electrodes 35. The solvent contained in the solution 36 may be evaporated through heating that is carried out at a higher temperature than room temperature, depending on the semiconductor material to be used. Furthermore, in the case of using a semiconductor material that forms a semiconductor film through light irradiation, it is irradiated with light after the solvent evaporates.

Next, as shown in FIG. 3G, a solution 38 in which an organic insulating material has been dissolved is placed between the two electrodes 35. As in the case of the solution 36, the solution 38 does not spread over the upper surfaces of the electrodes 35 and therefore is placed accurately between the two electrodes 35. In other words, the solution 38 comes into contact with only the side faces of the electrodes 35 and does not come into contact with the upper surfaces of the electrodes 35.

The solution 36 and the solution 38 can be placed by the ink-jet method or the screen printing method, for example. Particularly, when the distance between the two electrodes 35 is 100 µm or smaller, the ink-jet method allows the pattern to be formed more accurately.

As shown in FIG. 3H, after the solvent contained in the solution 38 evaporates, a gate insulating film 39 is formed between the two electrodes 35. The solvent contained in the solution 36 may be evaporated through heating that is carried out at a higher temperature than room temperature, depending on the insulating material to be used. Furthermore, in the case of using an insulating material that forms an insulating layer through light irradiation, it is irradiated with light after the solvent evaporates.

Finally, as shown in FIG. 3I, a gate electrode 40 is formed on the gate insulating film 39. Thus a field effect transistor is formed. The gate electrode 40 can be formed by a vacuum vapor deposition method using a shadow mask. In this example, the gate insulating film 39 was formed between the source electrode and the drain electrode but may be formed over the whole substrate 31.

Figure 5A:
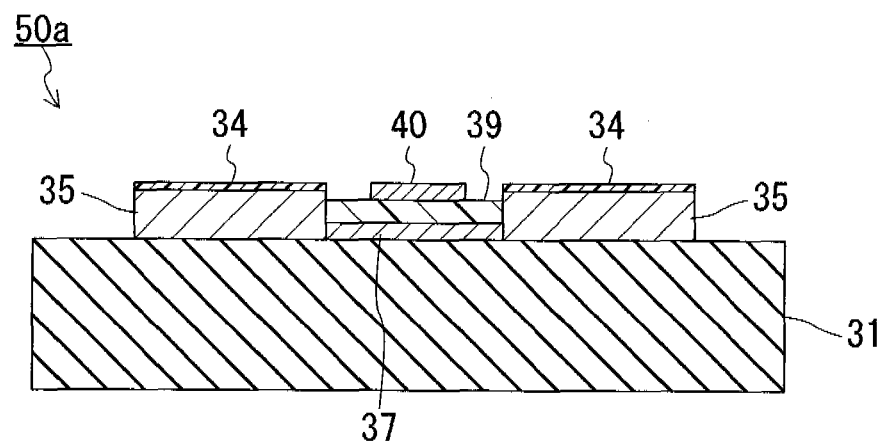
FIGS. 5A and 5B are cross-sectional views, each of which shows an example of the field effect transistor that is manufactured by the manufacturing method of the present invention.
Figure 5B:
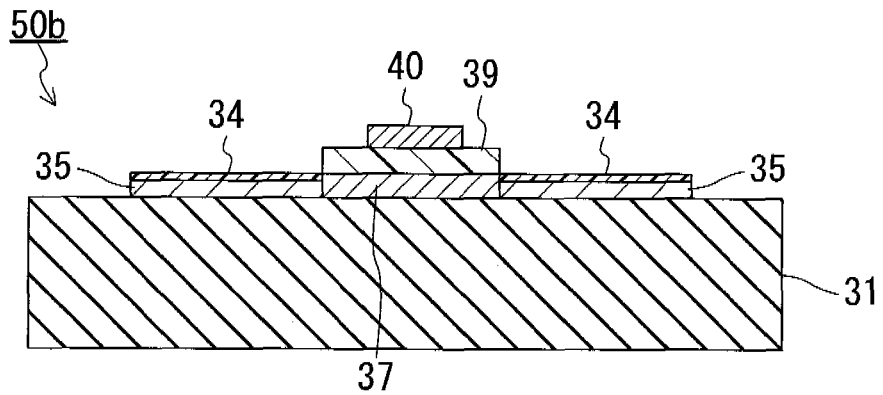

FIGS. 5A and 5B are schematic views, each of which shows the cross-section of a FET that is formed in this embodiment. The FETs 50a and 50b shown in FIG. 5A and FIG. 5B each include a substrate 31, an organic molecular film 34, two electrodes 35 (a source electrode and a drain electrode), an organic semiconductor film 37, a gate insulating film 39, and a gate electrode 40.

In the FET 50a, the electrodes 35 are thicker than the organic semiconductor film 37 and the gate insulating film 39. On the other hand, in the FET 50b, the electrodes 35 are thinner than the organic semiconductor film 37 and the gate insulating film 39. In both the FETs, the organic semiconductor film 37 and the gate insulating film 39 are in contact only with the side faces of the electrodes 35 and are not in contact with the upper surfaces thereof.

In the FETs 50a and 50b, the organic semiconductor film 37 and the gate insulating film 39 do not extend into any regions other than that present between the two electrodes 35. It therefore is possible to integrate a number of transistors on a substrate. Furthermore, in the FETs 50a and 50b, the organic semiconductor film 37 is not in contact with the upper surfaces of the source electrode and the drain electrode. Accordingly, the FET of the present invention has an effect that noise current caused by light irradiation is reduced as compared to a conventional FET in which the organic semiconductor film 37 is in contact with the upper surfaces of the electrodes. Hereinafter, this is described in detail.

In a FET, the value of current flowing between the source and drain electrodes is controlled with a gate voltage that is applied to the gate electrode. That is, a carrier density of the semiconductor film that is present between the source and drain electrodes varies with the gate voltage and the value of current flowing between the source and drain electrodes varies accordingly. This carrier density also increases when the semiconductor film is irradiated with light with greater energy than an energy gap of the semiconductor film. Hence, when the semiconductor film of the FET is irradiated with light, there is a possibility that current may flow regardless of the value of the gate voltage. This generates noise during the operation of the transistor. In order to decrease such noise, it is preferable that the semiconductor film be prevented from being irradiated with light. In the FET of this embodiment, the semiconductor film is not present on the upper surfaces of the source and drain electrodes. A small area of the semiconductor film is irradiated with light as compared to the conventional FET in which the semiconductor film also is present on the upper surfaces of those electrodes. As a result, the noise current caused by light can be reduced.

Organic semiconductor molecules that are dissolved in a solution can be used for the material of the organic semiconductor film 37. An example of the organic semiconductor material is a polythiophene derivative, for instance, poly(3-alkylthiophene), poly(9,9-dialkylfluorene-co-bithiophene), etc. In addition, it also is possible to use polycyclic aromatic molecules including a functional group that provides a solution with solubility. One example of such functional groups is a sulfanilacetamido group (R—CO—N=S=O, where R denotes a functional group). Moreover, examples of the polycyclic aromatic molecules that are used as an organic semiconductor material include pentacene.

It has been known that a polycyclic aromatic molecule having semiconductor characteristics and a sulfanilacetamido group are bonded to each other through a C—N bond and a C—S bond (where C denotes aromatic carbon while N and S each indicate an element contained in the sulfanilacetamido group). The sulfanilacetamido group can be bonded to a polycyclic aromatic molecule through the Diels-Alder reaction. Since a polycyclic aromatic molecule with a sulfanilacetamido group added thereto is dissolved in a solution, a thin film of the molecules can be formed by a coating method. Polycyclic aromatic molecules with a sulfanilacetamido group added thereto do not have semiconductor characteristics. The thin film therefore does not serve as a semiconductor film. However, when the thin film is heated to at least 100° C., the Reverse Diels-Alder reaction occurs and thereby the sulfanilacetamido group separates from the polycyclic aromatic molecules. As a result, the organic semiconductor film is formed.

The solvent to be used for dissolving the semiconductor material can be chloroform, toluene, tetrahydrofuran, etc. In order to bring the semiconductor film into contact only with the side faces of the electrodes, a solvent having lower wettability to the film of the molecules (M) is preferable.

It also is possible to use the manufacturing method of the present invention to form, on one substrate, a plurality of field effect transistors to be used as driver elements of displays or integrated circuits. According to the present invention, it is possible to dispose the semiconductor film only between the source electrode and the drain electrode of each transistor and not to dispose it between transistors. Hence, leakage current can be prevented from flowing between the transistors through the semiconductor film. As a result, these integrated circuits and driver elements operate with high accuracy.

Moreover, in the manufacturing method of the present invention, a source electrode and a drain electrode, each of which has an upper surface with liquid repellency, can be formed and then can be used to dispose the semiconductor film accurately in a predetermined position. It therefore is possible to form a circuit with FETs provided in a high density.

Embodiment 3

Another example of the method of manufacturing a FET is described with reference to FIGS. 6A to 6I. With respect to the materials and formation methods to be used for the respective members, descriptions of the same items as those described in Embodiment 2 may be omitted in some cases.

Figure 6E:
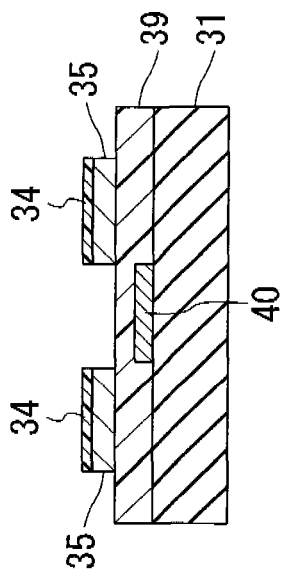
FIGS. 6A to 6G are cross-sectional views showing steps of another example of the method of the present invention for manufacturing a field effect transistor.
Figure 6F:
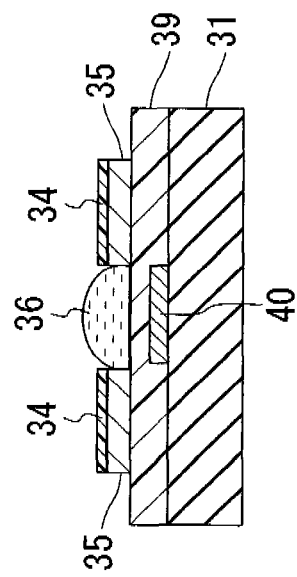
Figure 6G:
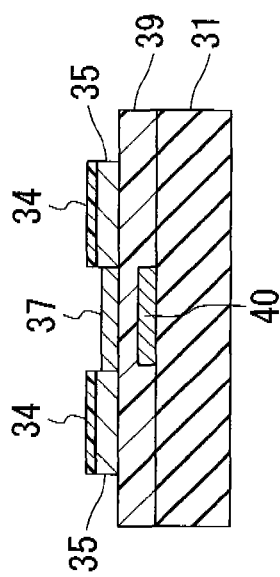
Figure 6A:
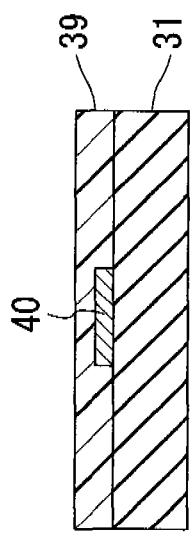

First, as shown in FIG. 6A, a gate electrode 40 and a gate insulating film 39 are formed on a substrate 31. The gate electrode 40 can be formed by a vacuum vapor deposition method that is carried out using a shadow mask, or a photolithography method. The gate insulating film 39 can be formed by spin coating of a solution in which an insulating material has been dissolved.

Figure 6B:
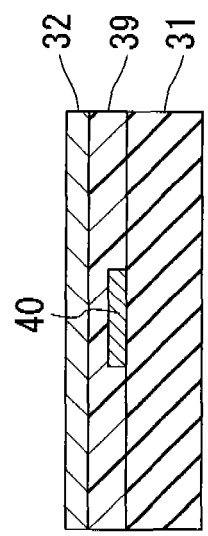
Figure 6C:
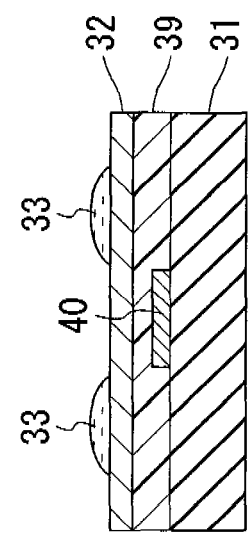

Next, as shown in FIG. 6B, a conductive film 32 is formed on the gate insulating film 39. Subsequently, as shown in FIG. 6C, a solution 33 in which the molecules (M) have been dissolved is discharged onto the conductive film 32 by the ink-jet method and thereby is placed into the form of a source electrode and a drain electrode. As described in Embodiment 1, the solution 33 placed on the conductive film 32 does not spread. Accordingly, the solution 33 is placed accurately in a predetermined position.

Figure 6D:
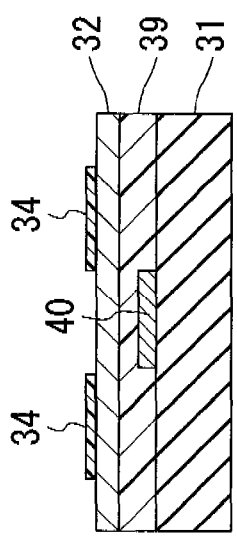

After the solvent contained in the solution 33 located on the conductive film 32 evaporates, an organic molecular film 34 of the molecules (M) is formed in the region where the solution 33 were present (FIG. 6D). The organic molecular film 34 is a monomolecular film or a film in which the molecules (M) have deposited irregularly on the monomolecular film. The organic molecular film 34 has a function as a resist film.

Next, the conductive film 32 is exposed to an etchant that dissolves the conductive film 32. Thus only the conductive film 32 located in the regions covered with the pattern of the organic molecular film 34 remains while the conductive film 32 located in the other regions is removed. As a result, the pattern of the electrodes 35 (a source electrode and a drain electrode) is formed as shown in FIG. 6E. The upper surfaces of the electrodes 35 are covered with the molecules (M) having a fluoroalkyl chain and therefore has liquid repellency.

Subsequently, a solution 36 in which an organic semiconductor material has been dissolved is placed between the two electrodes 35. As shown in FIG. 6F, the solution 36 does not spread over the electrodes 35 whose upper surfaces have liquid repellency and therefore is present only between the two electrodes 35. That is, the solution 36 comes into contact with only the side faces of the electrodes 35 and does not comes into contact with the upper surfaces thereof. The solution 36 can be placed by the ink-jet method or the screen printing method, for example. When the distance between the two electrodes 35 is 100 μm or smaller, the ink-jet method allows the pattern to be formed more accurately.

As shown in FIG. 6G, after the solvent contained in the solution 36 evaporates, an organic semiconductor film 37 is formed between the two electrodes 35. Thus a FET is formed.

Figure 7A:
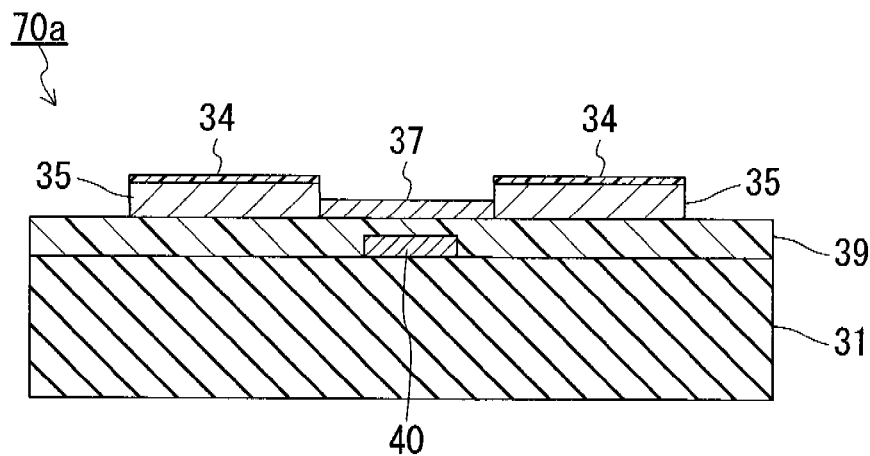
FIGS. 7A and 7B are cross-sectional views, each of which shows another example of the field effect transistor that is manufactured by the manufacturing method of the present invention.
Figure 7B:
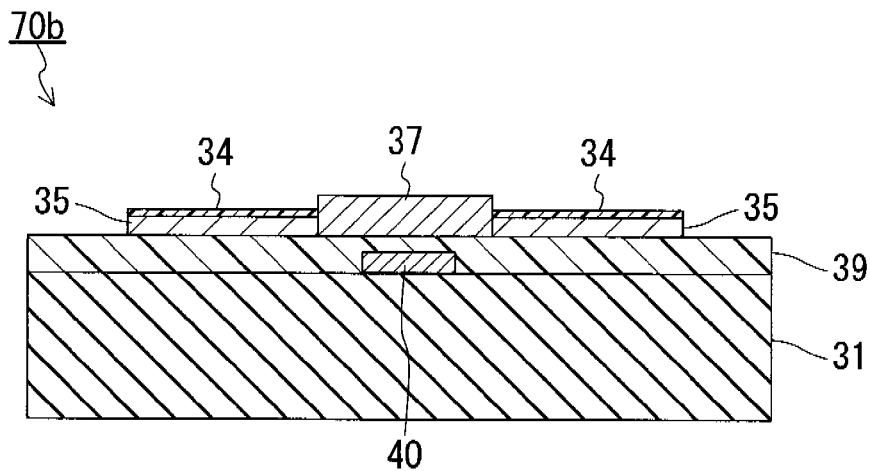

FIGS. 7A and 7B are schematic views, each of which shows the cross-section of a FET that is formed in this embodiment. The FETs 70a and 70b shown in FIG. 7A and FIG. 7B each include a substrate 31, an organic molecular film 34, two electrodes 35 (a source electrode and a drain electrode), an organic semiconductor film 37, a gate insulating film 39, and a gate electrode 40.

In the FET 70a, the electrodes 35 are thicker than the organic semiconductor film 37. On the other hand, in the FET 70b, the electrodes 35 are thinner than the organic semiconductor film 37. In both the FETs, the semiconductor film 37 is in contact only with the side faces of the electrodes 35 and is not in contact with the upper surfaces thereof. Such a configuration allows FETs to be integrated in a high density. Furthermore, the noise that is caused by light irradiation is reduced as compared to the conventional transistors.

Next, an example of the ink-jet printer that is applicable to the present invention is described with reference to FIGS. 8 and 9. A common ink-jet printer for printing on paper can be used for the printer.

Figure 8:
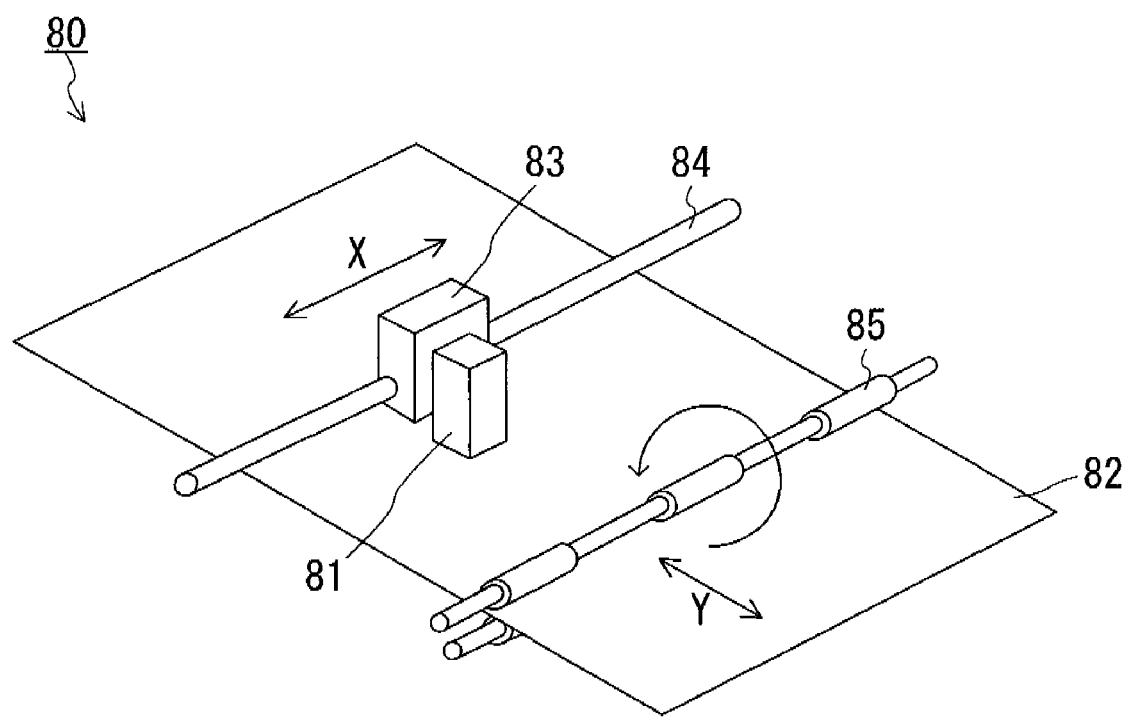
FIG. 8 is a schematic view showing a whole ink-jet apparatus that is applicable to the present invention.

FIG. 8 is a schematic view showing a main part of an ink-jet printer. A printer 80 shown in FIG. 8 is provided with an ink-jet head 81 that discharges a liquid using the piezoelectric effect of a piezoelectric device. The printer 80 discharges ink drops from the ink-jet head 81 toward a substrate 82. The ink-jet head 81 is mounted on a carriage 83 and reciprocates in the scanning direction X in response to the reciprocation of the carriage 83 along a carriage shaft 84. The printer 80 further is provided with a plurality of rollers 85 that move the substrate 82 relatively in the direction (a scanning direction Y) perpendicular to the ink-jet head 81. The ink-jet head 81 includes a nozzle plate having a nozzle opening through which ink is discharged, a driving part for discharging ink from the nozzle opening, and a part for feeding ink to the nozzle opening.

Figure 9A:
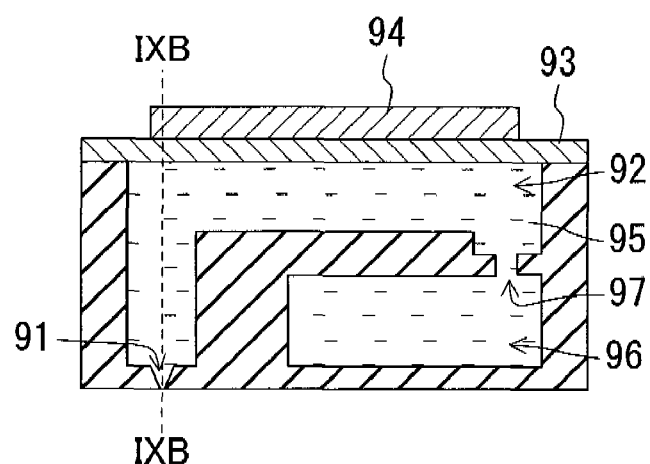
FIG. 9A is a cross-sectional view that schematically shows the vicinity of one nozzle opening of an ink-jet head.
Figure 9B:
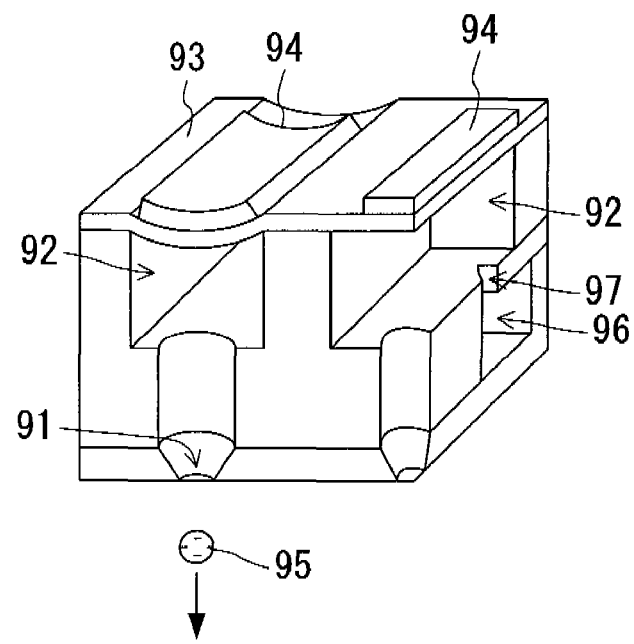
FIG. 9B is an exploded perspective view taken along line IXB-IXB shown in FIG. 9A.

FIGS. 9A and 9B schematically show the ink discharge part of the printer 80. FIG. 9A is a cross-sectional view showing the nozzle opening 91 and the vicinity thereof. The nozzle opening 91 communicates with a pressure chamber 92. A vibrating plate 93 and a piezoelectric device 94 are disposed above the pressure chamber 92. The pressure chamber 92 is filled with ink 95. The ink 95 is fed from an ink channel 96 through an ink supply opening 97. When voltage is applied to the piezoelectric device 94, the piezoelectric device 94 and the vibrating plate 93 are bent, which results in an increase in pressure of the pressure chamber 92 to discharge the ink 95 from the nozzle opening 91. The surface of the nozzle plate in which the nozzle opening 91 is formed is subjected to a liquid-repellent treatment so that the ink 95 is discharged from the nozzle opening 91 in a fixed direction.

FIG. 9B is a perspective view obtained by cutting the ink discharge part shown in FIG. 9A in the plane perpendicular to the paper surface through the dotted line shown in FIG. 9A. FIG. 9B shows only the configuration of the vicinities of two nozzle openings. In practice, however, many nozzle openings having the same configuration as those are placed in a line. FIG. 9B shows the state where the piezoelectric device 94 and the vibrating plate 93 that are located on the left side are bent and thereby the ink 95 is discharged from the nozzle opening 91.

Figure 9C:
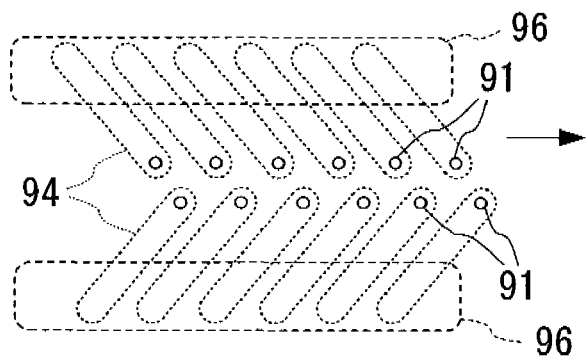
FIG. 9C is a plan view of a nozzle plate.

FIG. 9C is a plan view showing a part of an example of the nozzle plate. In the upper row of the example shown in FIG. 9C, 100 nozzle openings 91 are placed in a line at 340-μm spacings while similarly in the lower row of this example, 100 nozzle openings 91 are placed in a line at 340-μm spacings (FIG. 9C shows only a part thereof). The nozzle array of the upper row and the nozzle array of the lower row are 170 μm apart from each other. In FIG. 9C, the piezoelectric device 94 located on the farside of the nozzle plate as well as the ink channel 96 each are indicated with a wavy line. The ink 95 is fed from one ink channel 96 to 100 nozzle openings 91 placed in a line.

EXAMPLES

Hereinafter, specific examples of the present invention are described.

Example 1

(a) Preparation of Substrate

A glass substrate (with a size of 50 mm×50 mm and a thickness of 1 mm) was subjected to ultrasonic cleaning in ethanol for 10 minutes and then was dried at room temperature. Subsequently, a gold thin film (with a thickness of 100 nm) was formed on the glass substrate using a vacuum sputtering apparatus.

(b) Preparation of Discharge Solution to be Discharged by Ink-Jet Method

An ethanol solution in which 1 vol % of predetermined organic molecules had been dissolved was prepared The organic molecules used herein were $CF_3(CF_2)_n(CH_2)_mSH$ (where n indicates an integer in the range of 0 to 7 while m denotes a natural number in the range of 2 to 18) or $CH_3(CH_2)_{15}SH$. The $CH_3(CH_2)_{15}SH$ was purchased from Wako Pure Chemical Industries, Ltd. The $CF_3(CF_2)_n(CH_2)_mSH$ was purchased or was synthesized by a well-known method. The synthetic process is described in U.S. Pat. No. 6,509,100, U.S. Pat. No. 3,773,826, "Journal of Fluorine Chemistry (vol. 104, 2000, p 173-183)", and "Journal of Fluorine Chemistry (vol. 93, 1999, p 107-115)", for example.

(c) Preparation of Ink-Jet Apparatus

The ink-jet apparatus described in Embodiment 3 was prepared and one ink chamber was filled with a discharge solution. A substrate and the ink-jet head were allowed to move relative to each other so that the discharge solution can be placed in a predetermined position of the substrate.

In the ink-jet head of the ink-jet apparatus used in the example, a copper plate (with a thickness of 3 μm) was used as the vibrating plate while lead zirconate titanate (PZT) with a thickness of 3 μm was used as the piezoelectric device. The PZT was formed by the vacuum sputtering method and had a (001) orientation in the direction perpendicular to the film. The nozzle opening had a diameter of 20 μm. The nozzle opening was formed by the electrodischarge machining process. A total of 400 nozzle openings were disposed in four rows. Each row was composed of 100 nozzle openings aligned at 340-μm spacings. The spacing between adjacent rows was 170 μm. The solution was discharged by applying a voltage with a frequency of 10 KHz and an amplitude of 20V to the piezoelectric device.

(d) Formation and Evaluation of Metal Pattern

The discharge solution was discharged onto a predetermined region (with a size of 500 μm×500 μm) of a metal film (a gold film) by the ink-jet method and thereby was placed in a predetermined pattern. Thereafter, it was dried at room temperature for 30 minutes. Thus, an organic molecular film was formed on the metal film. Subsequently, the substrate was exposed to an etchant for gold for 15 seconds and then was washed with pure water. The etchant for gold used herein was a solution that was obtained by saturating an aqueous solution with oxygen gas. The aqueous solution had a KOH concentration of 1M and a KCN concentration of 0.1 mM.

The pattern of the organic molecular film formed by the ink-jet method was evaluated by the following method. The metal film with the organic molecular film formed thereon was placed in an atmosphere with a relative humidity of 100%. The surface of the metal film then was observed with an optical microscope. In the atmosphere with a relative humidity of 100%, water vapor adheres to the glass substrate. Since the region where the organic molecular film has been formed has higher liquid repellency as compared to the glass surface, water vapor that has adhered to this region is repelled to form minute water droplets. Hence, the region where the organic molecular film has been formed looks whitish because light is scattered in the region. On the other hand, water vapor that has adhered to the glass surface with no organic molecular film formed thereon forms a uniform liquid film. Accordingly, the region where the organic molecular film has been formed can be identified with the optical microscope. Thus the shape and the area of the organic molecular film were evaluated using the optical microscope. In addition, a ratio of the area of the organic molecular film to the area (250000 µm$^2$) of the region where the solution had been placed was calculated.

The metal pattern formed after the etching also was observed with the optical microscope and thereby the shape and area thereof were evaluated. The evaluation results are indicated in Table 1.

lency that was required for repelling the discharge solution was formed. The molecules, however, had a short hydrocarbon chain, the monomolecular film formed on the metal film was not dense, and thus the etchant passed through the molecular film. Conceivably, as a result, the molecular film didn't serve as a resist film satisfactorily.

When a solution in which $CF_3(CF_2)_n(CH_2)_mSH$ ($0 \leq n \leq 2$, $8 \leq m \leq 18$) had been dissolved was used, the organic molecular film had an elliptical shape that was different from the target square pattern and the area thereof was larger than that of the target region. The metal pattern had the same shape as that of the organic molecular film. No pinholes existed in the metal pattern. These results can be interpreted as follows. That is, $CF_3(CF_2)_n(CH_2)_mSH$ ($0 \leq n \leq 2$, $8 \leq m \leq 18$) has a short fluoroalkyl chain. Accordingly, it is conceivable that the

TABLE 1

| Chemical Formula of Molecules Contained in Discharge Solution | Shape of Organic Molecular Film | Ratio between Area of Organic Molecular Film and Area of Region where Solution was placed | State and Area of Metal Pattern |
|---|---|---|---|
| $CF_3(CF_2)_n(CH_2)_mSH$ $0 \leq n \leq 2, 2 \leq m \leq 7$ | Ellipse | 40 to 60 | Ellipse with many minute pinholes present therein. Its area was about 70% of the organic molecular film. |
| $CF_3(CF_2)_n(CH_2)_mSH$ $3 \leq n \leq 7, 2 \leq m \leq 7$ | Square | 1.05 to 1.3 | Square with many minute pinholes present therein. Its area was about 70% of the organic molecular film. |
| $CF_3(CF_2)_n(CH_2)_mSH$ $0 \leq n \leq 2, 8 \leq m \leq 18$ | Ellipse | 40 to 60 | Ellipse substantially identical to the solution pattern. No pinholes existed therein. |
| $CF_3(CF_2)_n(CH_2)_mSH$ $3 \leq n \leq 7, 8 \leq m \leq 18$ | Square | 1.05 to 1.3 | Square substantially identical to the solution pattern. No pinholes existed therein. |
| $CH_3(CH_2)_{15}SH$ | Ellipse | 100 | Ellipse substantially identical to the solution pattern. No pinholes existed therein. |

When a solution in which $CF_3(CF_2)_n(CH_2)_mSH$ ($0 \leq n \leq 2$, $2 \leq m \leq 7$) had been dissolved was used, the organic molecular film had an elliptical shape that was different from the target square pattern and the area thereof was larger than that of the target region. Pinholes existed throughout the formed metal pattern. The area of the metal pattern except the pinhole portions was about 70% of the area of the organic molecular film. These results can be interpreted as follows. That is, $CF_3(CF_2)_n(CH_2)_mSH$ ($0 \leq n \leq 2$, $2 \leq m \leq 7$) has a short fluoroalkyl chain. Accordingly, it is conceivable that the monomolecular film having the liquid repellency that was required for repelling the discharge solution was not formed and the discharge solution therefore spread on the metal film. Furthermore, since the above-mentioned molecule had a short hydrocarbon chain, the monomolecular film formed on the metal film was not dense and thus the etchant passed through the molecular film. Conceivably, as a result, the molecular film didn't serve as a resist film satisfactorily.

When a solution in which $CF_3(CF_2)_n(CH_2)_mSH$ ($3 \leq n \leq 7$, $2 \leq m \leq 7$) had been dissolved was used, a target organic molecular film of a square shape was formed. Pinholes, however, existed throughout the metal pattern. These results can be interpreted as follows. In the case of $CF_3(CF_2)_n(CH_2)_mSH$ ($3 \leq n \leq 7$, $2 \leq m \leq 7$), the fluoroalkyl chain was long enough and therefore a monomolecular film having the liquid repelmonomolecular film formed herein did not have the liquid repellency that was required for repelling the discharge solution and the discharge solution therefore spread on the metal film. On the other hand, conceivably, the hydrocarbon chain of the above-mentioned molecules was long enough and a dense monomolecular film therefore was formed that served as a resist film with respect to the etchant.

When a solution in which $CF_3(CF_2)_n(CH_2)_mSH$ ($3 \leq n \leq 7$, $8 \leq m \leq 18$) had been dissolved was used, an organic molecular film of a target shape was formed. The metal pattern had the same shape as that of the organic molecular film and no pinholes existed in the metal pattern. It is surmised that since the above-mentioned molecules had sufficiently long fluoroalkyl and hydrocarbon chains, a dense monomolecular film was formed that had the liquid repellency required for repelling the discharge solution and therefore served as a resist film.

When a solution in which $CH_3(CH_2)_{15}SH$ had been dissolved was used, the organic molecular film had an elliptical shape that was different from the target square pattern and the area thereof was larger than that of the target region. The metal pattern had the same shape as that of the organic molecular film. No pinholes existed in the metal pattern. These results can be interpreted as follows. The above-mentioned molecules included no fluoroalkyl chain. Accordingly, it is conceivable that the molecular film formed herein didn't have the liquid repellency that is required for repelling the discharge solution and the solution pattern therefore spread. On the other hand, conceivably, the above-mentioned molecules had a sufficiently long hydrocarbon chain and a dense monomolecular film therefore was formed that served as a resist film with respect to the etchant.

As described above, the use of a solution in which $CF_3(CF_2)_n(CH_2)_mSH$ ($3 \leqq n \leqq 7$, $8 \leqq m \leqq 18$) had been dissolved allowed an accurate metal pattern to be formed.

Example 2

As in Example 1, a metal pattern was formed using an ethanol solution in which $CF_3(CF_2)_n(CH_2)_mSH$ ($3 \leqq n \leqq 7$, $8 \leqq m \leqq 18$) had been dissolved. Thereafter, the substrate was irradiated with ultraviolet light in an ozone atmosphere. Then the surface of the metal pattern was subjected to an elemental analysis after the irradiation and thereby a gold element alone was observed. From this result, it was proved that the $CF_3(CF_2)_n(CH_2)_mSH$ located on the metal film (the gold film) was removed completely.

Example 3

As in Example 1, a metal pattern was formed using an ethanol solution in which $CF_3(CF_2)_n(CH_2)_mSH$ ($3 \leqq n \leqq 7$, $8 \leqq m \leqq 18$) had been dissolved. Thereafter, the substrate was heat-treated at 300° C. for 10 minutes. Then the surface of the metal pattern thus heat-treated was subjected to an elemental analysis and thereby a gold element alone was observed. From this result, it was proved that the $CF_3(CF_2)_n(CH_2)_mSH$ located on the metal film was removed completely.

Example 4

As in Example 1, metal patterns were formed using an ethanol solution in which $CF_3(CF_2)_3(CH_2)_{11}SH$ had been dissolved. In this example, however, 100 metal patterns having the same shape were formed on the substrate. Furthermore, as a control, 100 square gold patterns with a size of 500 μm×500 μm were formed on the substrate used in Example 1, using a common photolithography method.

Next, these substrates with the metal patterns formed thereon were allowed to stand for one week in an ordinary indoor environment. Next, nitrogen gas was blown on the substrate surfaces. Thereafter, a gold wire was bonded to each of the surfaces of the 100 metal patterns using a wire bonding apparatus. With respect to one metal pattern, when the gold wire was not bonded thereto successfully after three trials, the pattern was judged to be unbondable. With respect to the metal patterns produced by the method of the present invention and those produced by the photolithography method, the number of bondable patterns was checked.

As a result, 90 patterns of the metal patterns formed by the manufacturing method of the present invention were bondable. On the other hand, in the case of the metal patterns formed using the photolithography method, 30 of them were bondable. It is surmised that the cause of the unsuccessful bonding between the metal pattern and the gold wire was contaminants that had adhered to the metal surfaces when they were allowed to stand inside a room. The metal patterns formed according to the present invention each have a monomolecular film of fluoroalkyl mercaptan formed on the surface thereof and therefore their surfaces have liquid repellency. Accordingly, the contaminants that have adhered to the surfaces can be removed easily by blowing nitrogen gas thereon. As a result, conceivably, a larger number of metal patterns such as wiring, electrodes, etc. formed by the manufacturing method of the present invention were able to be bonded to a gold wire as compared to the metal patterns formed by the photolithography method.

As described above, the metal patterns formed by the manufacturing method of the present invention were difficult to contaminate as compared to the metal patterns formed by the photolithography method and therefore were easy to be connected electrically.

Example 5

(a) Preparation of Substrate

A polycarbonate substrate (with a size of 50 mm×50 mm and a thickness of 1 mm) was subjected to ultrasonic cleaning in ethanol for 10 minutes and then was dried at room temperature. Subsequently, a gold thin film (with a thickness of 100 nm) was formed on the substrate using a vacuum sputtering apparatus.

(b) Preparation of Liquid for Ink-Jet Discharge

An ethanol solution (Solution 1) in which 1 vol % of $CF_3(CF_2)_3(CH_2)_{11}SH$ had been dissolved was prepared as a solution for forming an organic molecular film that served as a resist film. A chloroform solution (Solution 2) in which 1 vol % of poly(3-hexylthiophene) had been dissolved was prepared as a solution for forming an organic semiconductor film. Furthermore, an isopropyl alcohol solution (Solution 3) in which 1 vol % of polyvinylphenol had been dissolved was prepared as a solution for forming a gate insulating film.

(c) Preparation of Ink-Jet Apparatus

The ink-jet apparatus described in Embodiment 3 was used. The three ink chambers were filled with Solutions 1 to 3, respectively. A substrate and the ink-jet head were allowed to move relative to each other so that the respective liquids were placed in predetermined positions of the substrate.

(d) Production of Field Effect Transistor

Figure 10:
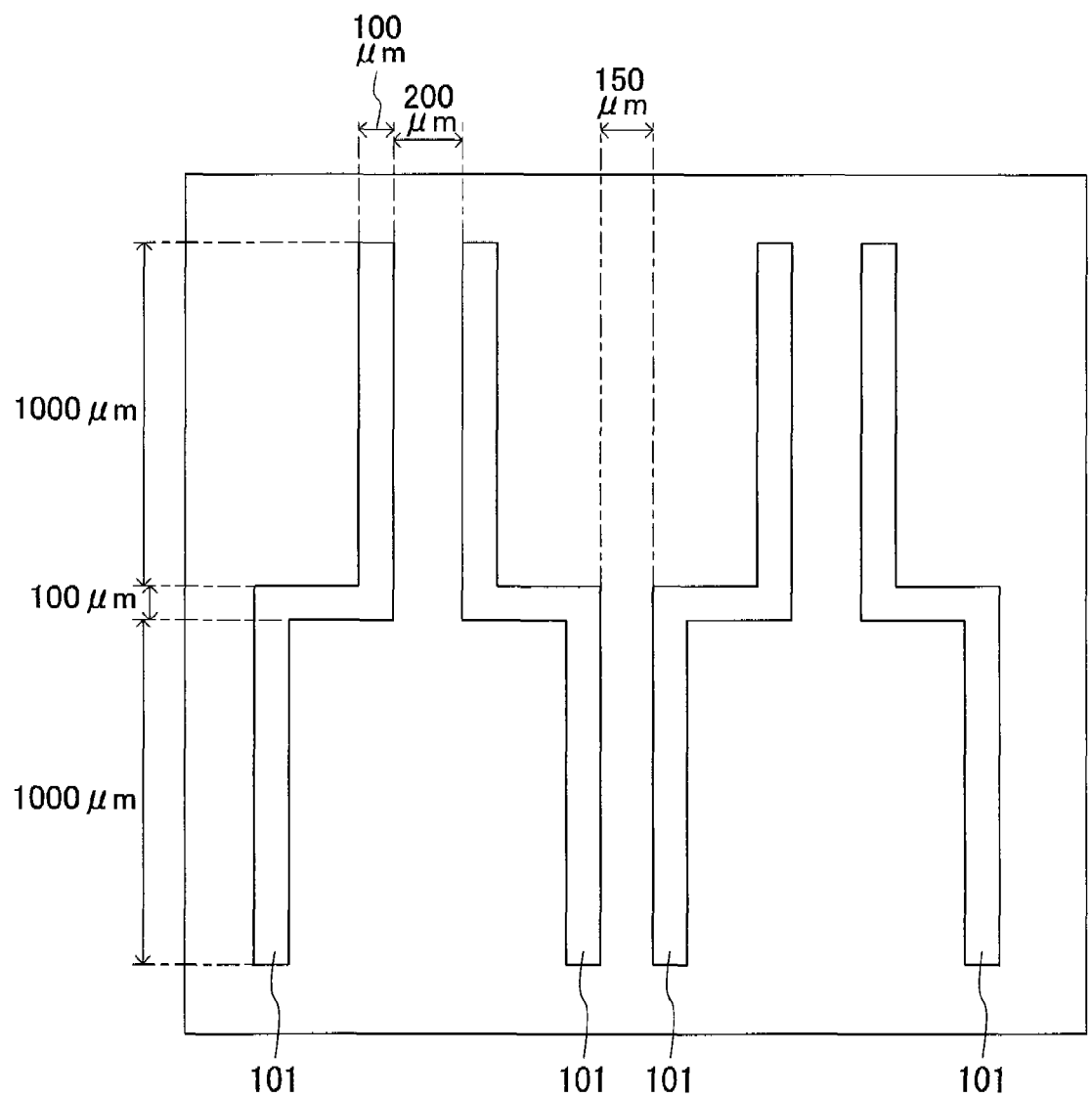
FIG. 10 is a plan view showing a region where source electrodes and drain electrodes are formed in the FET according to Example 5.

Solution 1 described above was applied to a gold film located on the polycarbonate substrate by the ink-jet apparatus and then was dried at room temperature for 30 minutes. Solution 1 was applied to form the shapes of the regions 101 shown in FIG. 10. Thus, an organic molecular film was formed that served as a resist film. Subsequently, this substrate was exposed to an etchant for gold for 15 seconds and then was washed with pure water. The etchant to be used herein was the same as in Example 1. Thus, source electrodes and drain electrodes were formed.

Figure 11:
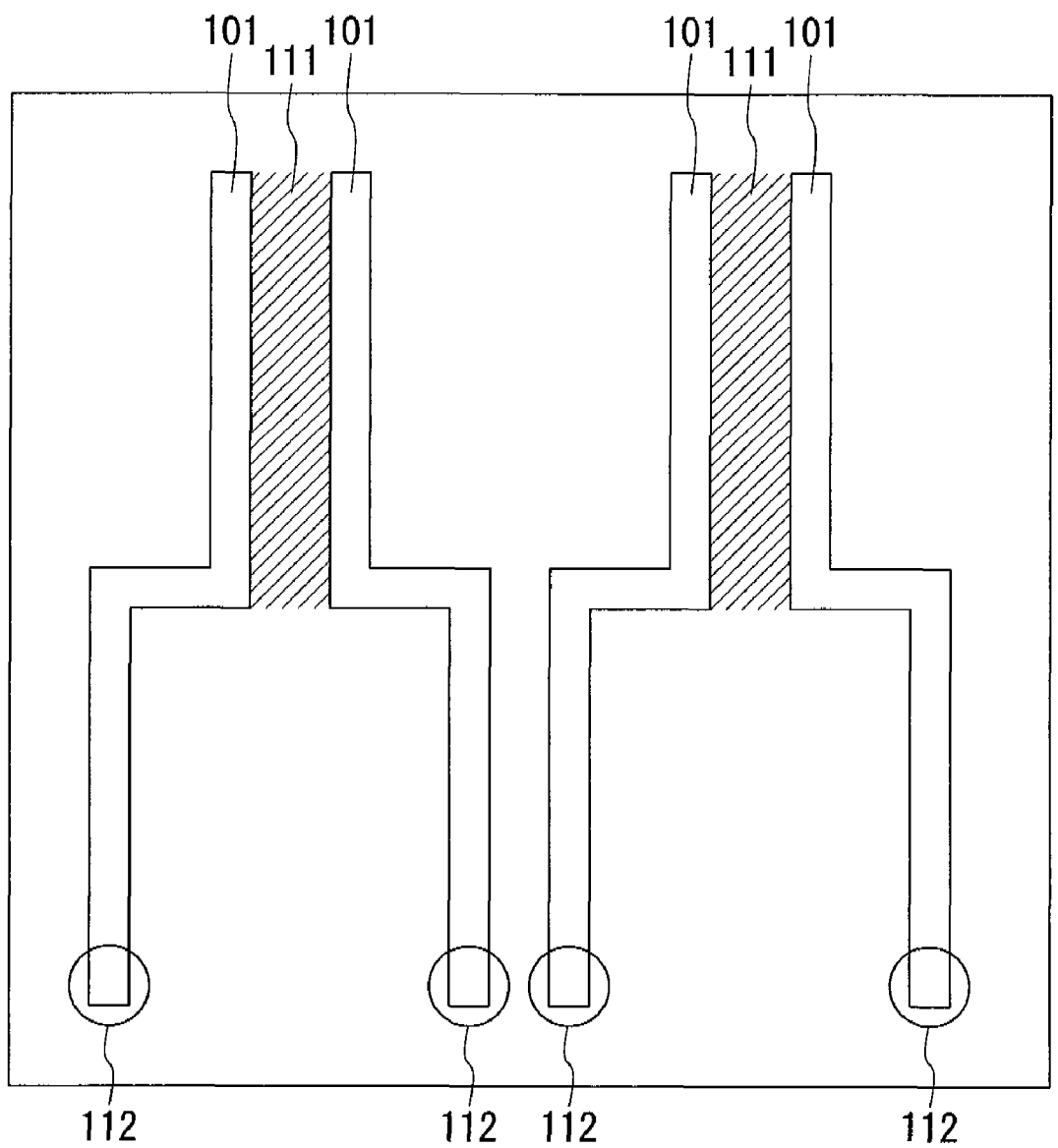
FIG. 11 is a plan view showing the configuration of the source electrodes, the drain electrodes, and gate electrodes of the FET according to Example 5.

Next, Solution 2 described above was applied to the regions 111 hatched in FIG. 11 by the ink-jet apparatus and then was dried at room temperature for 30 minutes. Thus, an organic semiconductor film was formed.

Figure 12:
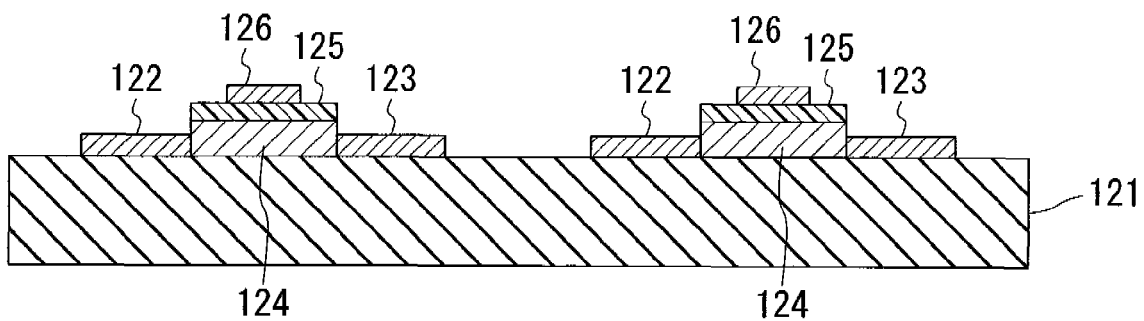
FIG. 12 is a cross-sectional view showing the FET formed in Example 5.

Next, Solution 3 described above was applied to the regions 111 by the ink-jet apparatus and then was dried. Thus a gate insulating film was formed. Finally, gold was vacuum-vapor-deposited on the rectangular regions (with a size of 30 μm×50 μm) located in the center of the regions 111, using a shadow mask. Thus gate electrodes were formed. FIG. 12 shows a cross-sectional view of FETs formed in Example 5. Two FETs are formed on a substrate 121. Each FET includes a source electrode 122, a drain electrode 123, an organic semiconductor film 124, a gate insulating film 125, and a gate electrode 126.

The organic semiconductor film 124 and the gate insulating film 125 were formed between the source electrode 122 and the drain electrode 123, with the respective solutions substantially being prevented from spreading. As a result, a field effect transistor was formed that had a shape with the size as designed.

(e) Evaluation of Electrical Connectivity of FET

With respect to the FETs thus produced, the electrical connectivity at the ends (regions 112 shown in FIG. 11) of the source electrodes and the drain electrodes was evaluated. For the evaluation, square gold electrode terminals with a size of 1000 μm×1000 μm were formed 1000 μm away from the regions 112, respectively. Then, the electrode terminals and the regions 112 were connected to each other by wire bonding, respectively, and then the ease of connection was checked. Specifically, the substrate on which the electrode terminals and the FETs had been formed was allowed to stand in an indoor environment for 24 hours. Thereafter, wire bonding was carried out using gold wires in 30 places (120 places in total) between four regions 112 and four electrode terminals and thereby it was checked whether they were connected to each other successfully. When the surface of the gold film has contaminants, the gold wire is not bonded to the surface of the gold film.

In the regions 112, the gold wire was bonded in 110 places but was not bonded in 10 places. On the other hand, in the electrode terminals, the gold wire was bonded only in 20 places. It is surmised that this was because the monomolecular film with liquid repellency had been formed in the regions 112 and thereby contaminants tended not to adhere thereto, but on the other hand, contaminants adhered easily to the square gold surfaces with no monomolecular film formed thereon. Thus, when the surfaces of the source electrode and the drain electrode are covered with a liquid repellent monomolecular film, such electrodes had better electrical connectivity.

Example 6

FETs were produced using the materials and apparatus described in Example 5. In this example, however, bottom gate type transistors were produced, in each of which the gate electrode is located on the substrate side with respect to the semiconductor film. The method of manufacturing the field effect transistors is described below.

A gold thin film was vapor-deposited on a substrate by the vapor sputtering method using a shadow mask and thereby gate electrodes (with a size of 200 μm×1000 μm) were formed. Subsequently, Solution 3 was applied to the substrate by the spin coating method and then was dried at room temperature. Thus, a gate insulating film was formed.

Figure 13:
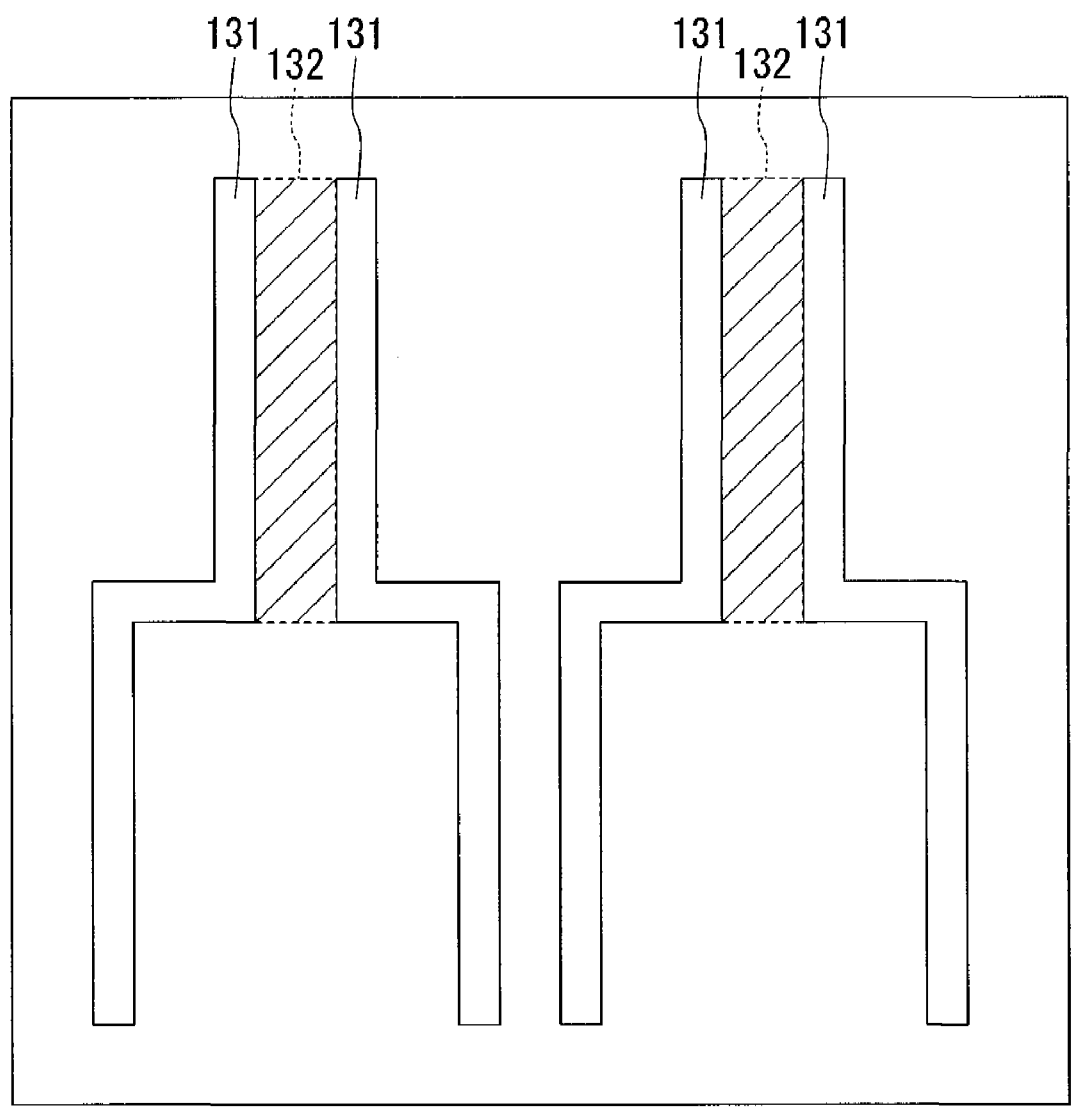
FIG. 13 is a plan view showing the configuration of source electrodes, drain electrodes, and gate electrodes of the FET according to Example 6.
Figure 15A:
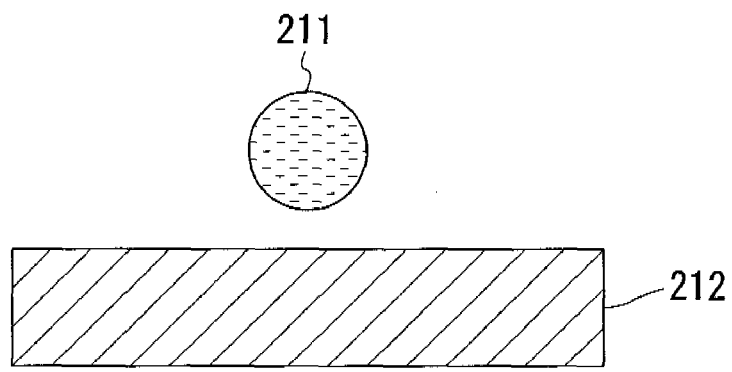
FIGS. 15A to 15C are drawings that show the manner in which a liquid placed on a substrate by a conventional ink-jet method spreads thereon.
Figure 15B:
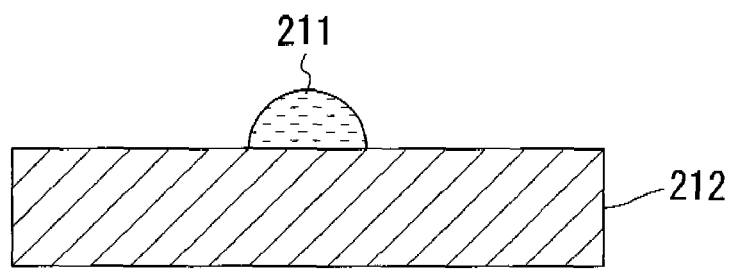
Figure 15C:
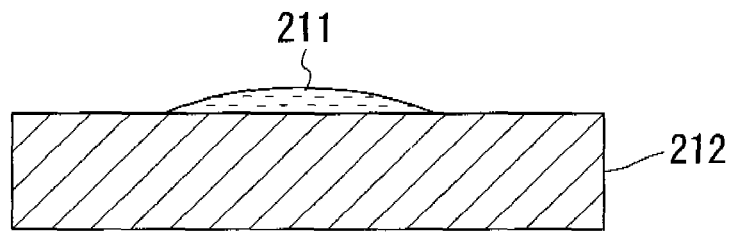

Next, a gold thin film was formed by the vacuum sputtering method so as to cover the gate insulating film. Thereafter, Solution 1 was used to form an organic molecular film 131 having the shape shown in FIG. 13. In this case, the organic molecular film 131 was formed to sandwich a gate electrode 132 (indicated with dotted line and hatching in FIG. 13) located under the gate insulating film therebetween.

Subsequently, the substrate with the organic molecular film 131 formed thereon was exposed to the etchant for gold described in Example 1 for 15 seconds and then was washed with pure water. Thus, source electrodes and drain electrodes were formed.

Next, Solution 2 was applied to each region located between a source electrode and a drain electrode with the ink-jet apparatus and then was dried at room temperature for 30 minutes. Thus, an organic semiconductor film was formed. The organic semiconductor film was formed between the source electrode and the drain electrode, with the solution substantially being prevented from spreading.

Example 7

FETs were produced in the same manner as in Example 5. In this example, however, the source electrodes and the drain electrodes were formed of not gold but copper. Furthermore, a 5-wt % ferric chloride aqueous solution was used as an etchant. In this example, the FETs having a size as designed also were produced as in Example 5. The FETs thus produced were excellent in electrical connectivity like the FETs of Example 5.

Example 8

FETs were produced in the same manner as in Example 5. In this example, however, the source electrodes and the drain electrodes were formed of not gold but silver or platinum. These metal films were produced by the electron beam vapor deposition method and had a thickness of 300 nm. In the case of using silver, an aqueous solution containing $K_3Fe(CN)_6$ whose concentration was 0.01 M and $K_2S_2O_3$ whose concentration was 0.1 M was used as an etchant. The etchant used in the case of using platinum was a solution obtained by mixing 36-wt % HCl and 30-wt % hydrogen peroxide in water together at a volume ratio of 3:1.

In this example, FETs having a size as designed also were produced as in Example 5. The FETs thus produced were excellent in electrical connectivity like the FETs of Example 5.

Example 9

FETs were produced in the same manner as in Example 5. In this example, however, the source electrodes and the drain electrodes were formed of not gold but a compound of aluminum and indium phosphide (in which the mole ratio of Al:InP was 8:2) or a compound of aluminum and gallium arsenide (in which the mole ratio of Al:GaAs was 8:1). These alloy films were produced by the vacuum sputtering method. The film of the compound of aluminum and indium phosphide was formed by simultaneously sputtering an aluminum target and an indium phosphide target with RF plasma. The composition of the compound was adjusted by changing the sputtering condition for each target. Similarly, the film of the compound of aluminum and gallium arsenide was produced using an aluminum target and a gallium arsenide target.

A mixed aqueous solution of a 40-wt % ferric chloride aqueous solution and 4-vol % hydrochloric acid was used as the etchant for the films of the compounds described above.

In this example, FETs having a size as designed also were produced as in Example 5. The FETs thus produced were excellent in electrical connectivity like the FETs of Example 5.

As described above, in the method of the present invention for manufacturing a conductive pattern and a FET, it is not necessary to use an expensive photomask. Accordingly, the method is particularly useful when various kinds of circuits of printed boards are to be produced in small quantities. Furthermore, the distance the ink-jet head travels can be increased theoretically without limit. Hence, the manufacturing method of the present invention is useful for the manufacture of electrodes (a gate electrode, a source electrode, a drain electrode, etc.) of driver elements of liquid crystal displays or large-sized electroluminescent displays.

Furthermore, it also is possible to discharge a liquid while the ink-jet head is moved three-dimensionally. Hence, according to the manufacturing method of the present invention, it is possible to form a metal pattern on a curved surface. In a small electric device such as a mobile phone, it is necessary to use any empty space inside the device without wasting it. Accordingly, it is necessary to form a circuit on the surface of a part having a shape that perfectly fits into an empty space inside the device. Hence, the manufacturing method of the present invention is particularly useful for the manufacture of small devices such as mobile phones.

Moreover, according to the manufacturing method of the present invention, a field effect transistor can be produced easily on a large-area plastic substrate. The FETs manufactured by the manufacturing method of the present invention are desirable as driver elements of circuits of light and thin portable devices, etc.

INDUSTRIAL APPLICABILITY

The present invention is applicable to a method of manufacturing conductive patterns that will serve as metal electrodes and metal wires, and to electronic devices (for example, field effect transistors) having metal electrodes and metal wires.

The invention claimed is:

1. A method of manufacturing a conductive pattern, comprising the steps of:
(i) forming a molecular film of at least one kind of molecule on a part of a conductive film by placing, on the conductive film, a solution in which the at least one kind of molecule has been dissolved, the one kind of molecule being selected from the group consisting of
a molecule that is expressed by Formula (1):

$$CF_3(CF_2)_n(CH_2)_mSH \qquad (1),$$

where n indicates a natural number in a range of 3 to 7 while m denotes a natural number in a range of 8 to 18; and
a molecule that is expressed by Formula (2):

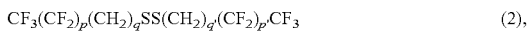

$$CF_3(CF_2)_p(CH_2)_qSS(CH_2)_{q'}(CF_2)_{p'}CF_3 \qquad (2),$$

where p and p' each are a natural number in a range of 3 to 7 independently while q and q' each are a natural number in a range of 8 to 18 independently, and
(ii) removing the conductive film located in a part where the molecular film has not been formed, by bringing the conductive film into contact with an etchant for the conductive film.

2. The method of manufacturing a conductive pattern according to claim 1, wherein the conductive film includes at least one selected from the group consisting of gold, silver, copper, platinum, gallium arsenide, and indium phosphide.

3. The method of manufacturing a conductive pattern according to claim 1, wherein the conductive film is formed on a resin substrate.

4. A method of manufacturing an electronic device including a conductive pattern, the method comprising the steps of:
(I) forming a molecular film of at least one kind of molecule on a part of a conductive film by placing, on the conductive film, a solution in which the at least one kind of molecule has been dissolved, the one kind of molecule being selected from the group consisting of:
a molecule that is expressed by Formula (1):

$$CF_3(CF_2)_n(CH_2)_mSH \qquad (1),$$

where n indicates a natural number in a range of 3 to 7 while m denotes a natural number in a range of 8 to 18; and
a molecule that is expressed by Formula (2):

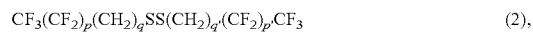

$$CF_3(CF_2)_p(CH_2)_qSS(CH_2)_{q'}(CF_2)_{p'}CF_3 \qquad (2),$$

where p and p' each are a natural number in a range of 3 to 7 independently while q and q' each are a natural number in a range of 8 to 18 independently, and
(II) forming the conductive pattern by bringing the conductive film into contact with an etchant for the conductive film and thereby removing the conductive film located in a part where the molecular film has not been formed.

5. The method of manufacturing an electronic device according to claim 4, wherein the conductive film includes at least one selected from the group consisting of gold, silver, copper, platinum, gallium arsenide, and indium phosphide.

6. The method of manufacturing an electronic device according to claim 4, wherein the conductive film is formed on a resin substrate.

7. The method of manufacturing an electronic device according to claim 4, wherein the electronic device is a field effect transistor and the conductive pattern comprises a source electrode and a drain electrode.

8. The method of manufacturing an electronic device according to claim 7, further comprising, after the step (II),
(III) forming an organic semiconductor film between the source electrode and the drain electrode by placing a solution between the source electrode and the drain electrode, the solution including an organic semiconductor material dissolved therein.

* * * * *